US010962586B2

(12) United States Patent
Henley

(10) Patent No.: US 10,962,586 B2
(45) Date of Patent: Mar. 30, 2021

(54) LIGHT EMITTING DIODE (LED) TEST APPARATUS AND METHOD OF MANUFACTURE

(71) Applicant: Apple Inc., Cupertino, CA (US)

(72) Inventor: Francois J. Henley, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 301 days.

(21) Appl. No.: 15/878,338

(22) Filed: Jan. 23, 2018

(65) Prior Publication Data

US 2018/0259570 A1  Sep. 13, 2018

Related U.S. Application Data

(60) Provisional application No. 62/449,554, filed on Jan. 23, 2017.

(51) Int. Cl.
*G01R 31/26* (2020.01)
*H01L 33/36* (2010.01)
(Continued)

(52) U.S. Cl.
CPC ...... *G01R 31/2635* (2013.01); *H01L 33/0095* (2013.01); *H01L 33/36* (2013.01); *H05B 45/00* (2020.01); *H01L 22/12* (2013.01)

(58) Field of Classification Search
CPC . G01R 31/2635; H01L 33/0095; H01L 33/36; H01L 22/12; H05B 33/0842
(Continued)

(56) References Cited

U.S. PATENT DOCUMENTS 4,622,515 A   11/1986 Everson
5,258,705 A   11/1993 Okamoto et al.
(Continued)

FOREIGN PATENT DOCUMENTS

CN   102087226 A   6/2011
DE   102013218062 A1   3/2015
(Continued)

OTHER PUBLICATIONS

International Search Report and Written Opinion for PCT/US2018/039533 Filed Jun. 26, 2018.
(Continued)

*Primary Examiner* — Melissa J Koval
*Assistant Examiner* — Courtney G McDonnough
(74) *Attorney, Agent, or Firm* — Jaffery Watson Mendonsa & Hamilton LLP

(57) ABSTRACT

Embodiments relate to functional test methods useful for fabricating products containing Light Emitting Diode (LED) structures. In particular, LED arrays are functionally tested by injecting current via a displacement current coupling device using a field plate comprising of an electrode and insulator placed in close proximity to the LED array. A controlled voltage waveform is then applied to the field plate electrode to excite the LED devices in parallel for high-throughput. A camera records the individual light emission resulting from the electrical excitation to yield a function test of a plurality of LED devices. Changing the voltage conditions can excite the LEDs at differing current density levels to functionally measure external quantum efficiency and other important device functional parameters.

32 Claims, 22 Drawing Sheets

(51) Int. Cl.
*H01L 33/00* (2010.01)
*H05B 45/00* (2020.01)
*H01L 21/66* (2006.01)

(58) Field of Classification Search
USPC .................................................. 324/762.07
See application file for complete search history.

(56) References Cited

U.S. PATENT DOCUMENTS

| | | | |
|---|---|---|---|
| 5,274,336 | A | 12/1993 | Crook et al. |
| 5,504,438 | A | 4/1996 | Henley |
| 5,629,838 | A | 5/1997 | Knight et al. |
| 6,825,673 | B1 | 11/2004 | Yamaoka |
| 6,859,062 | B2 | 2/2005 | Fujii et al. |
| 7,019,513 | B1 | 3/2006 | Faifer et al. |
| 7,414,409 | B1 | 8/2008 | Faifer et al. |
| 10,288,671 | B2 | 5/2019 | Schulz et al. |
| 10,600,697 | B2 | 3/2020 | Henley |
| 2006/0154390 | A1 | 7/2006 | Tran et al. |
| 2006/0157703 | A1 | 7/2006 | Kodama et al. |
| 2006/0201546 | A1 | 9/2006 | Yokoyama |
| 2009/0167339 | A1 | 7/2009 | Marshall et al. |
| 2010/0045334 | A1 | 2/2010 | Gardner et al. |
| 2010/0201374 | A1 | 8/2010 | Vasilyev et al. |
| 2010/0295560 | A1 | 11/2010 | Tran |
| 2011/0053295 | A1 | 3/2011 | Yoon et al. |
| 2011/0184678 | A1 | 7/2011 | Lee et al. |
| 2012/0122250 | A1 | 5/2012 | Ji et al. |
| 2012/0125169 | A1 | 5/2012 | Suda |
| 2014/0159733 | A1* | 6/2014 | Tsai ............... G01J 1/0223 324/414 |
| 2014/0184062 | A1 | 7/2014 | Kolodin |
| 2015/0295009 | A1 | 10/2015 | Wang et al. |
| 2016/0020155 | A1 | 1/2016 | Kim et al. |
| 2016/0217720 | A1† | 7/2016 | Chaji |
| 2018/0174931 | A1 | 6/2018 | Henley |
| 2019/0004105 | A1 | 1/2019 | Henley |
| 2020/0185283 | A1 | 6/2020 | Henley |

FOREIGN PATENT DOCUMENTS

| | | |
|---|---|---|
| DE | 102015101671 A1 | 8/2016 |
| EP | 2439517 A1 | 4/2012 |
| JP | H09-246599 A | 9/1997 |
| JP | 2006324588 A | 11/2006 |
| KR | 1020120037352 A | 4/2012 |
| KR | 1020150082414 A | 7/2015 |
| KR | 1020170023920 A | 3/2017 |
| TW | 1227326 B | 2/2005 |
| TW | 200638314 A | 11/2006 |
| WO | 2005/076885 A2 | 8/2005 |
| WO | 2015036368 A1 | 3/2015 |
| WO | 2017066921 A1 | 4/2017 |
| WO | 2018112267 A1 | 6/2018 |
| WO | 2018136970 A1 | 7/2018 |
| WO | 2018236767 A2 | 12/2018 |
| WO | 2018236767 A3 | 12/2018 |

OTHER PUBLICATIONS

International Search Report and Written Opinion for Application No. PCT/US2018/014917, dated May 1, 2018.
Written Opinion of the International Searching Authority for Application No. PCT/US2018/014917, dated May 1, 2018.
European Patent Application No. 17882095.7 "Supplementary European Search Report" dated Aug. 14, 2020, 10 pages.
European Patent Application No. 18741543.5, "Supplementary European Search Report" dated Jul. 9, 2020, 6 pages.
International Patent Application No. PCT/US2017/066530, "International Search Report and Written Opinion" dated May 9, 2018, 9 pages.
International Patent Application No. PCT/US2018/038112, "International Search Report and Written Opinion" dated Dec. 21, 2018, 16 pages.
U.S. Appl. No. 15/842,788, filed Dec. 14, 2017, Light Emitting Diode (LED) Test Apparatus and Method of Manufacture.
U.S. Appl. No. 16/788,104, filed Feb. 11, 2020, Light Emitting Diode (LED) Test Apparatus and Method of Manufacture.
U.S. Appl. No. 16/011,502, filed Jun. 18, 2018, Light Emitting Diode (LED) Test Apparatus and Method of Manufacture.

* cited by examiner
† cited by third party

Side View

Top View

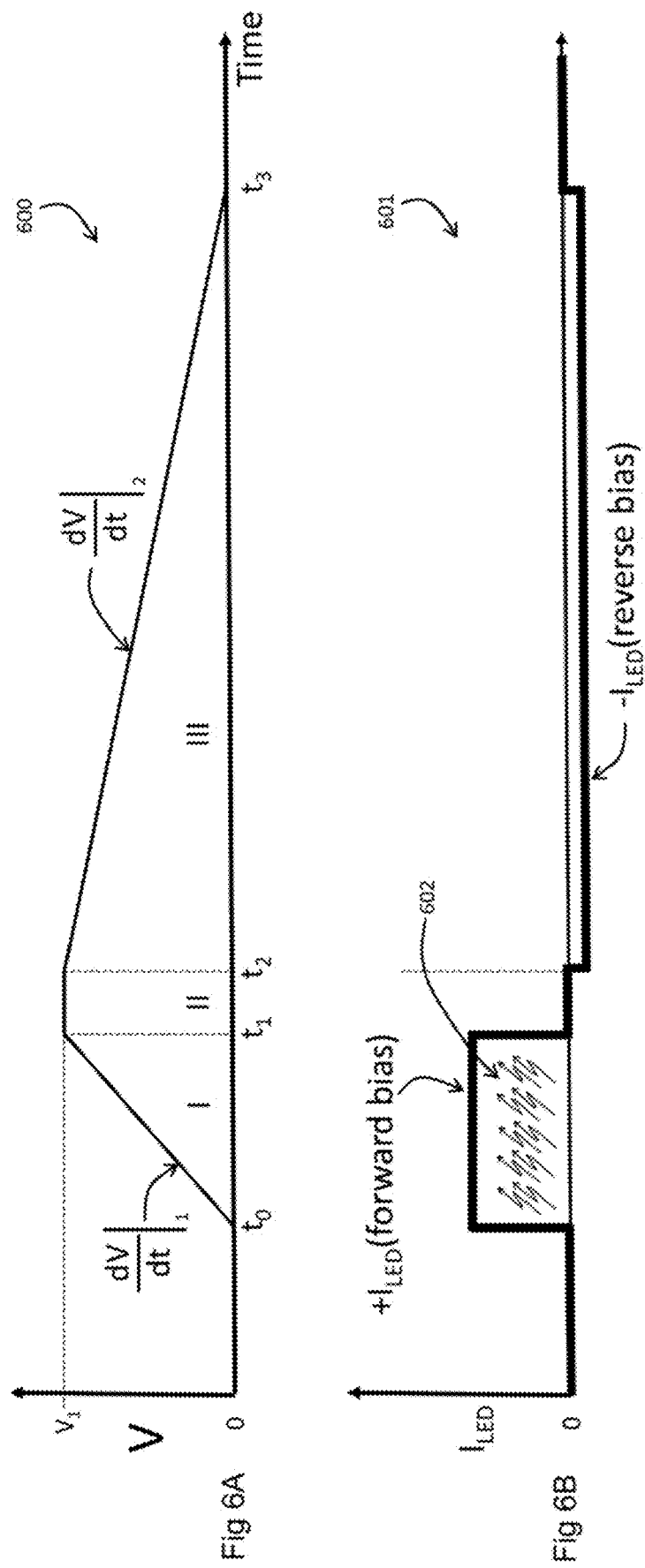

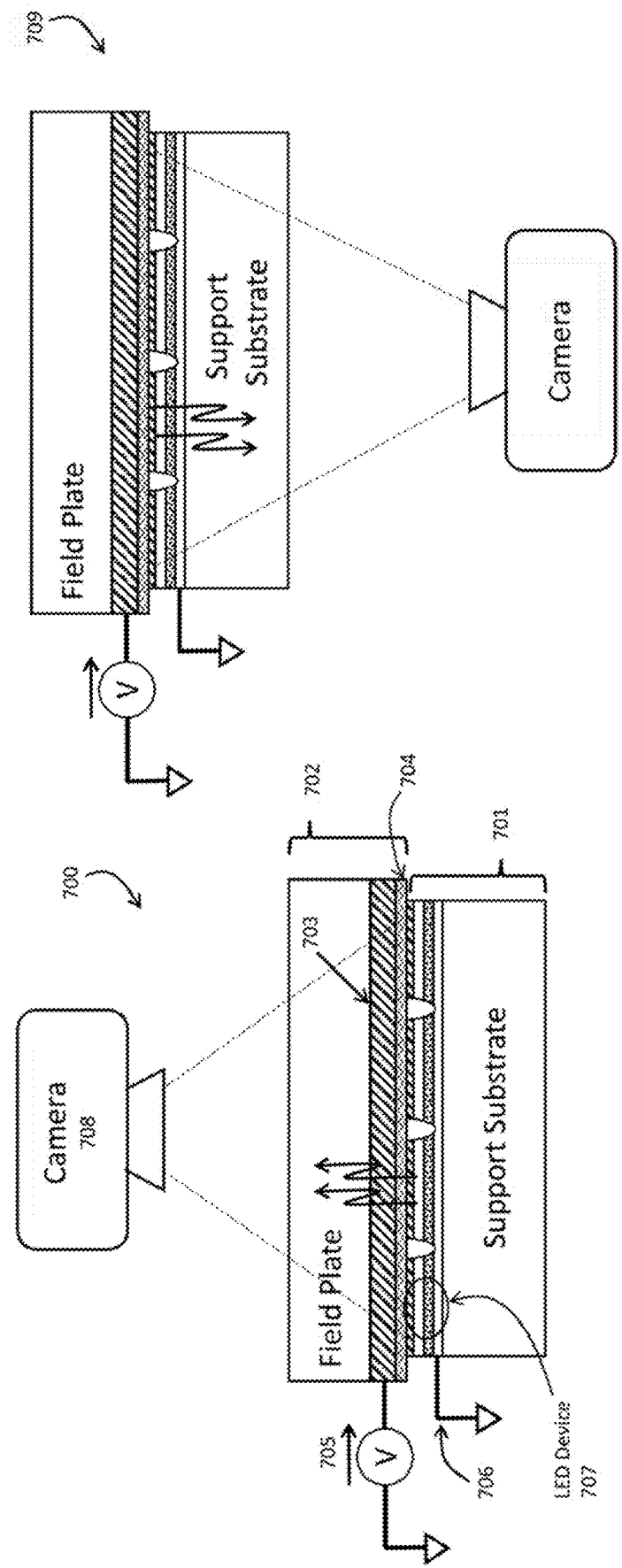

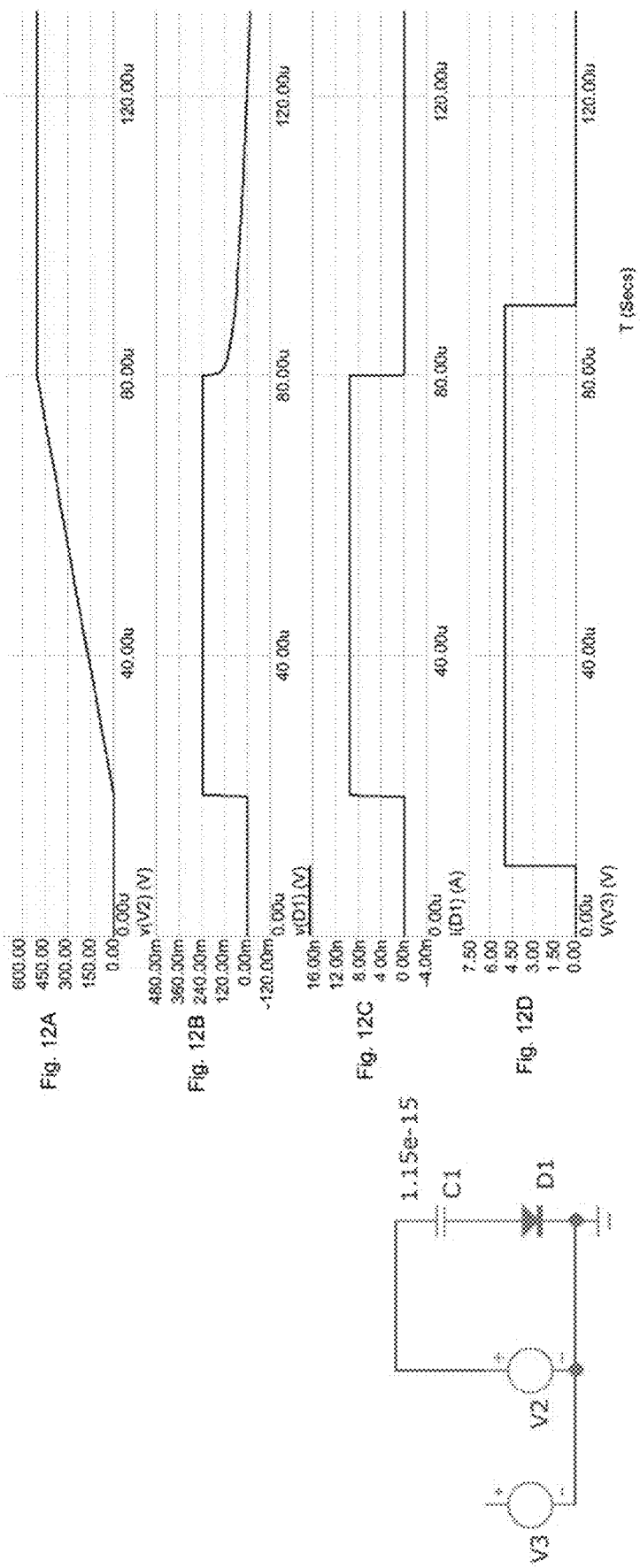

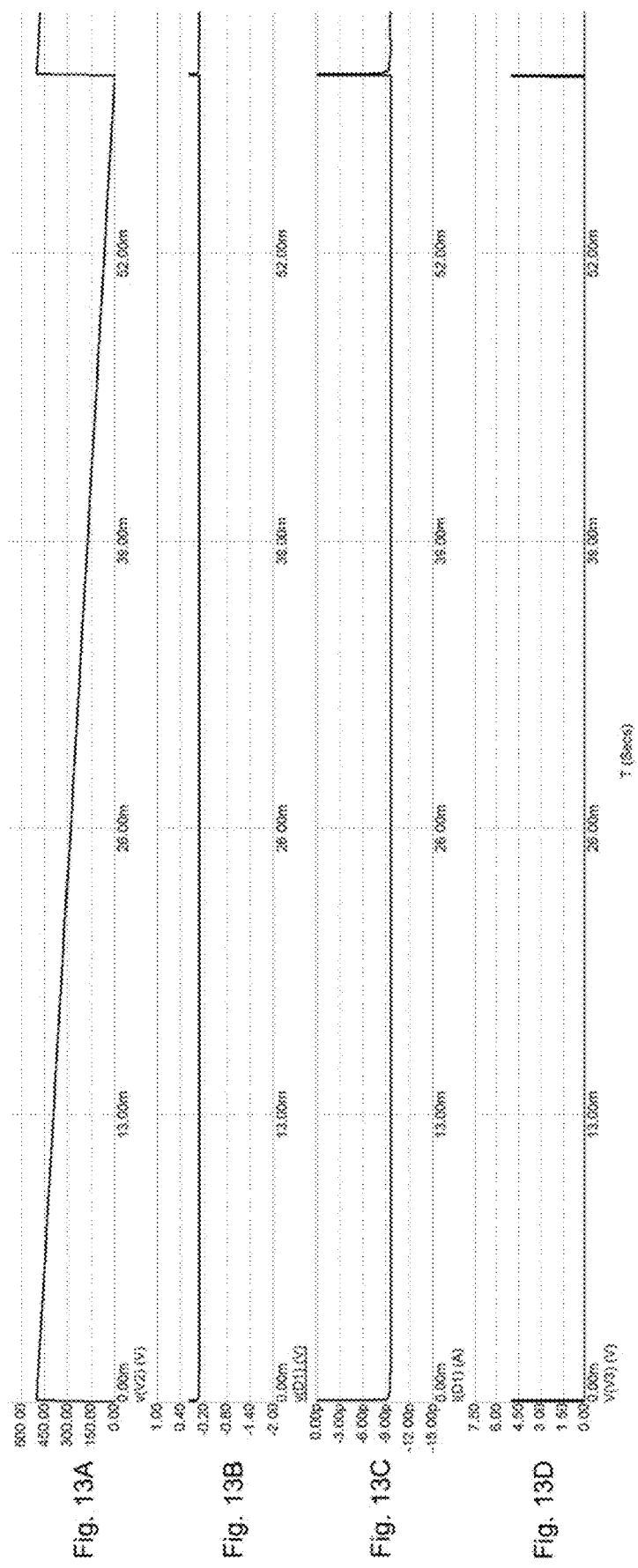

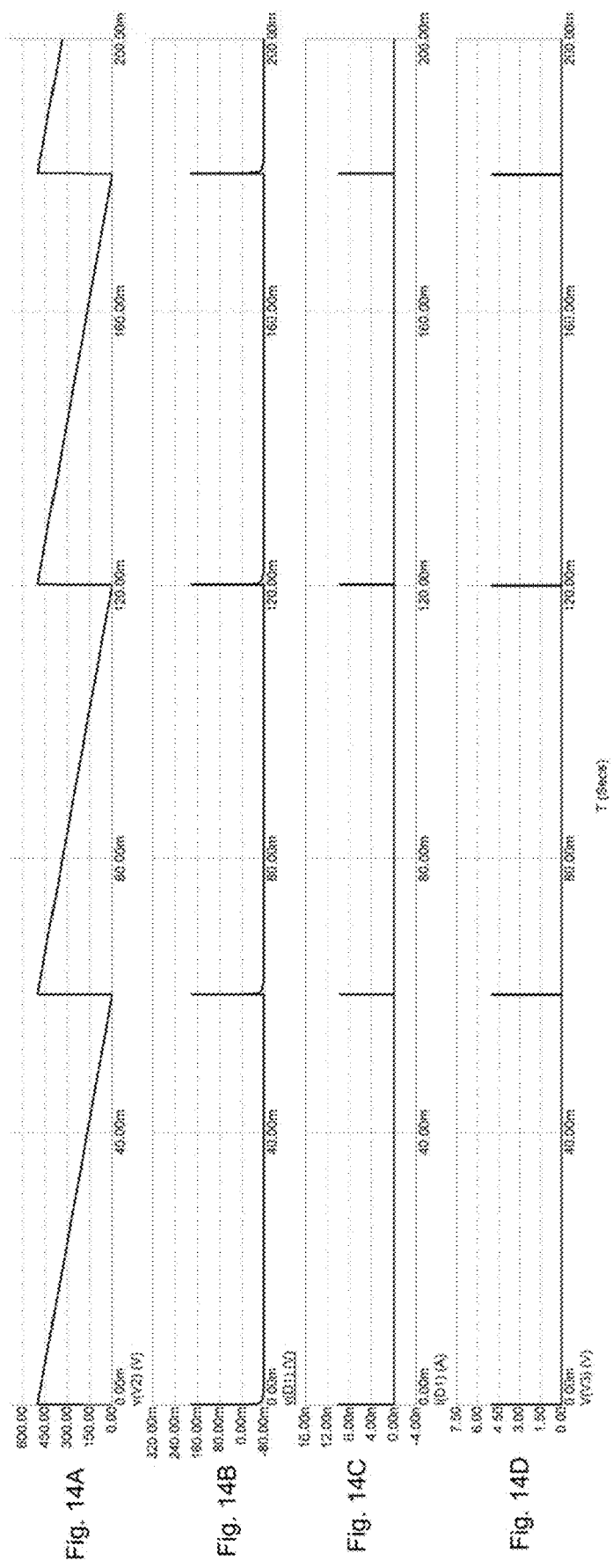

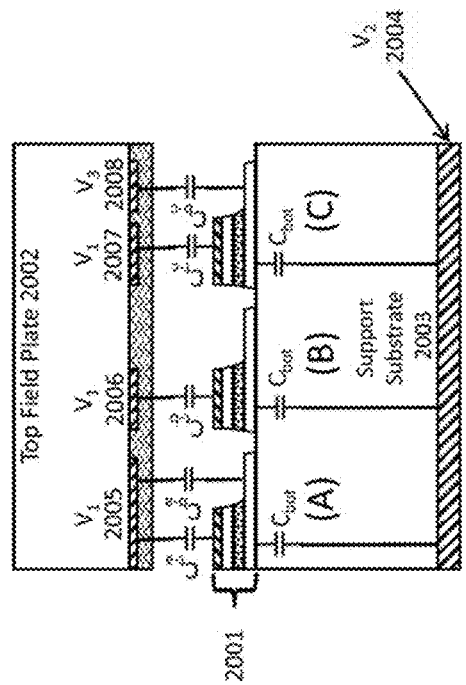
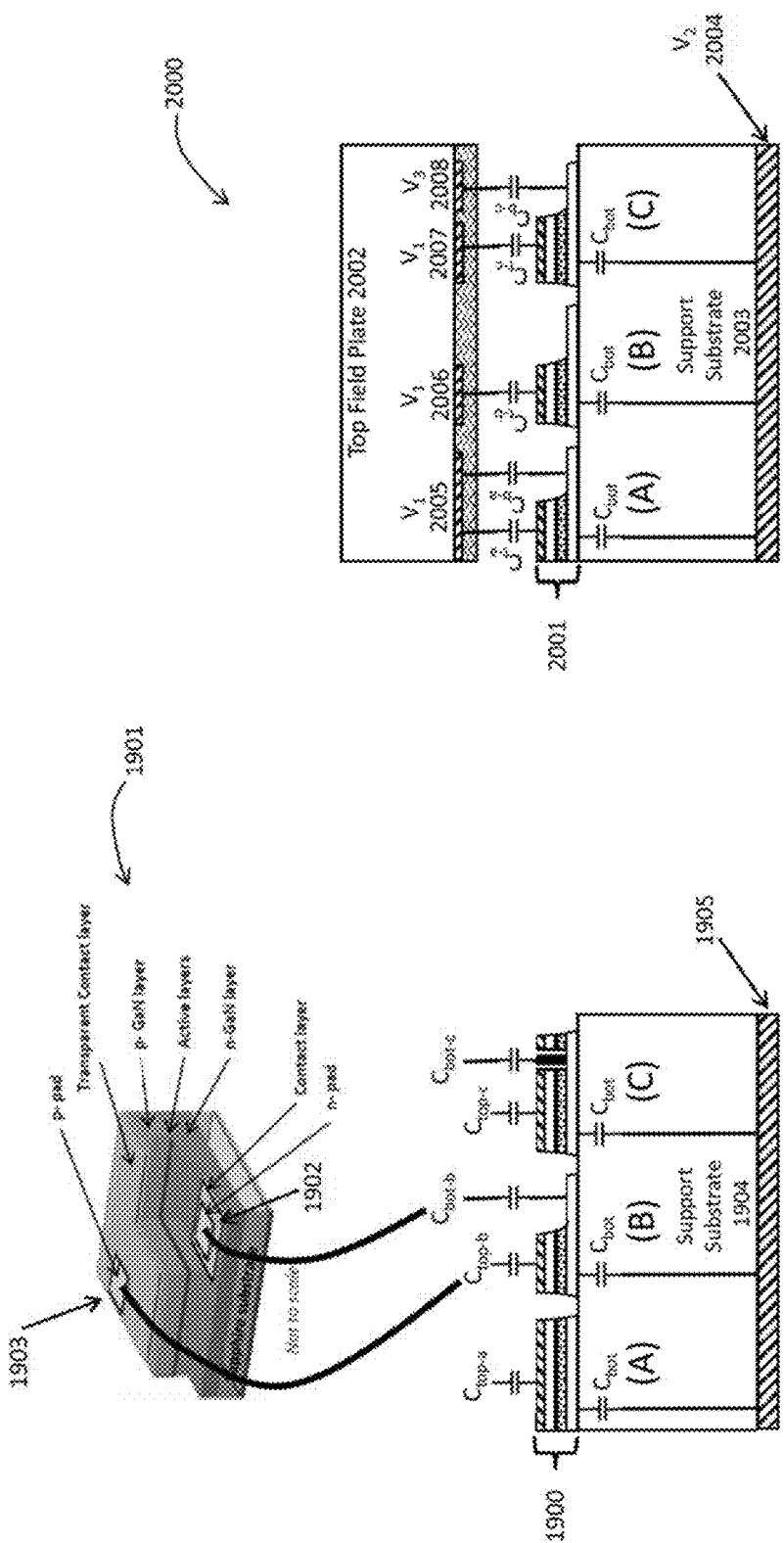
Figure 19
Figure 20

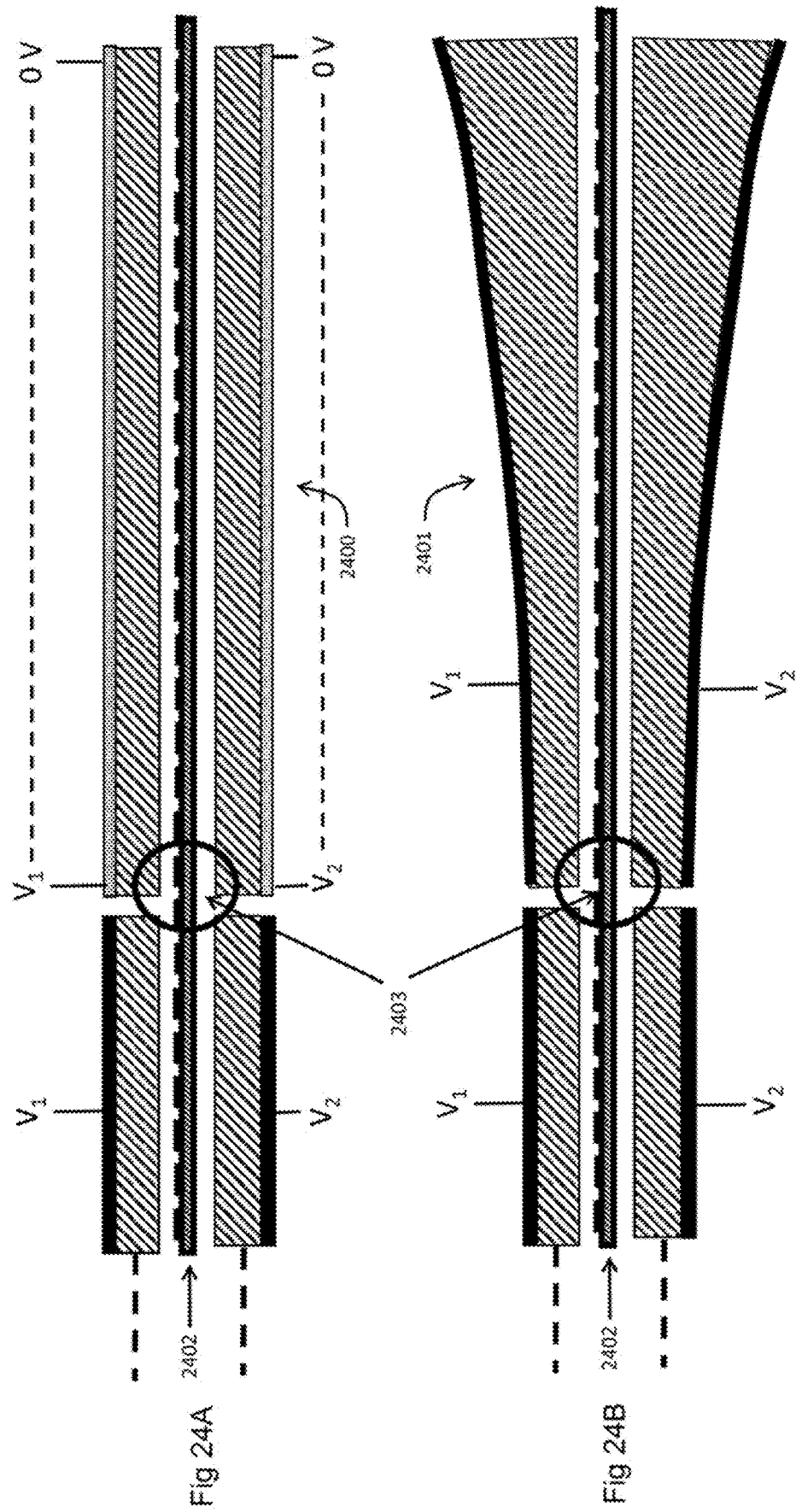

LIGHT EMITTING DIODE (LED) TEST APPARATUS AND METHOD OF MANUFACTURE

CROSS-REFERENCE TO RELATED APPLICATIONS

This application claims priority to U.S. Provisional Application No. 62/449,554, filed Jan. 23, 2017, commonly assigned and incorporated by reference herein for all purposes.

FIELD OF INVENTION

The present invention relates to light emitting diode (LED) devices. More particularly, embodiments of the invention relate to techniques, including methods and apparatus to functionally test a Light Emitting Diode (LED) array structure during the manufacturing process. In an example, the method is useful in general LED device functional testing and is particularly useful for functionally testing micro-LED (uLED) devices that can be as small as a few microns on a side. Micro-LEDs are grown on a support substrate utilizing techniques such as Metallo-Organic Chemical Vapor Deposition (MOCVD) among others. Before the individual devices are used in their final lighting or display application, it is desirable to test the LED devices to achieve one or more of the following: yield evaluation, binning, device repair/correction and collecting data for use in manufacturing process feedback/feedforward.

BACKGROUND OF INVENTION

Light emitting diodes (LEDs) have been used as a replacement technology for conventional light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

Although highly successful, improved techniques for manufacturing LEDs is highly desired.

SUMMARY

During the LED manufacturing process, LED structures are formed on a substrate using mass-production processes like those utilized by the semiconductor industry. Process steps such as cleaning, deposition, lithography, etching and metallization are used to form the basic LED structure. To achieve mass-production scale manufacturing and lower cost, numerous devices are simultaneously formed on a substrate using these processes. Different substrates and materials are used depending on the type of LED desired. For example, UV-emitting LEDs are typically made from Gallium Nitride (GaN) material that have usually been either a heteroepitaxial layer on sapphire or free-standing GaN substrates made using Hydride Vapor Phase Epitaxy (HVPE) or ammonothermal methods. For other colors, GaAs or GaP substrates can be used. Recently, GaN, GaAs or other III-V semiconductor materials layer-transferred onto a support substrate has become available as another starting substrate type. Other possible LED structures that can be tested using methods disclosed in this invention are organic LED (OLED) device structures fabricated on plastic, glass or other suitable substrates.

Within the LED structure formation manufacturing process, various optical and other metrology tests are made to confirm quality and repeatability. Once the LED structure formation has been completed, it is desirable to perform a functional test of each LED device before the device is mounted for use as a LED emitter within a package or as an LED emitter within a display. Even if there is a common contact to all devices (i.e. all cathodes are tied together), each individual anode of each device would still require individual contact in order to functionally test its optoelectronic characteristics. The device size and sheer volume of individual LED devices on a substrate makes this a challenging task. For example, a 6" substrate with LED devices measuring 250 µm on a side (typical of general lighting type LEDs) would contain over 250,000 devices, each requiring a contact probe/measurement cycle. If the 6" substrate contained micro-LED device structures of 20 µm on a side, there would be a need to contact each of the more than 40 million devices present on the substrate. There is therefore a need to develop methods that allows functional LED device testing without individual contact.

Embodiments of the invention utilizes a non-direct electrical contact approach where the current is injected through a capacitor formed using a dielectric-coated field plate driven by a suitable voltage waveform source. The other side of the dielectric surface forms a capacitor placed in proximity to the plane of the individual LED contacts and specific voltage waveforms are driven between the field plate electrode and a common LED contact or a second capacitively-coupled LED contact. In a preferred embodiment, a voltage ramp drives the electrodes to forward bias the LEDs situated between these electrodes, developing a displacement current that flows current into each of the large plurality of LED devices in a parallel fashion. The functional response (light emission) is then measured using an integrating camera disposed either above the field plate or below the LED support substrate depending on the embodiment. Image capture and processing can then extract many functional device tests in parallel. In this manner, as few as two electrical contacts could functionally test LED devices numbering in the millions.

After each measurement, the capacitive field plate and other coupling capacitance elements must be reset or in a manner that would not damage the LED devices through excessive reverse bias voltage. A suitably slow negative voltage ramp would allow the LED device's minimum leakage current to safely discharge the field plate capacitor without developing damaging reverse bias conditions. Another measurement cycle can then be repeated.

Changing the forward bias drive voltage ramp would drive differing forward bias current density ($A/cm^2$) into the LED devices, thereby allowing more complex functional test evaluations to be conducted. Device characterization data such as external quantum efficiency as a function of forward bias current density made possible by selecting different drive voltage waveforms are another feature of this invention. By modifying the field plate dielectric design and voltage ramp values, accurate current injection emission responses of a large plurality of devices can be detected over a large current density from about 0.001 to 10 or more A/cm2.

One benefit afforded by this functional test method is the elimination of high-pin count probe cards and probe needles that contact each addressable LED device under test. When such probe cards are used, each LED device is contacted using one or more needle probe pins that achieves electrical contact on a contact area by pressure and lateral motion of the sharp metallic pin. This process almost always produce contact pad scratches that can lower LED device yield and reliability. Test reliability, fabrication and maintenance costs of using probe pin cards having hundreds or even thousands of probe pins are also of concern. Elimination of probe card scratches or marks, increasing LED device yield and reliability and avoiding the use of expensive and failure-prone high-pin count probe cards is a key benefit of this invention.

Yet another benefit of afforded by this functional test method is the ability to functionally test within the LED manufacturing process due to the elimination of direct electrical contact. Clean-room compatible, scratch-free in-process testing of LED devices is a capability that would have otherwise being difficult or impractical to perform due to the necessity of high-density particle generating pin cards use by conventional test methods.

Other benefits afforded by this functional test method is its general applicability to both small and large LED devices and scalability to large substrates. The field plate is a structure that applies capacitance proportionally to area and thus, larger LED devices with more area are excited with a larger effective capacitance while small LED devices such as micro-LED devices are excited by a correspondingly smaller capacitance. Large LEDs of millimeter size on a side down to micro-LEDs as small as 10 µm or less on a side can therefore be tested with few modifications of the apparatus. Substrate scalability using larger field plates or using a step/repeat method with a smaller field plate is practical and readily achievable. For the highest throughput, parallel processing of multiple cameras arranged in an array over a large field plate would be able to functionally test all LED devices on a support substrate with as few as two electrical contacts and in some embodiments, with no direct electrical contact. Avoiding contacting each individual LED device that could number from many thousands to tens of millions on a substrate is a key benefit of this invention.

The method as described in this invention is described as Capacitive Current Injection ($C^2I$) functional testing.

BRIEF DESCRIPTION OF THE DRAWINGS

FIG. 6A shows the main Capacitive Current Injection ($C^2I$) measurement sequence: Current Injection/Measurement (I), Hold (II), Discharge/Reset (III) phases.

FIG. 6B shows the corresponding LED current injected by the Capacitive Current Injection ($C^2I$) measurement sequence of FIG. 6A.

FIGS. 7A-B show two embodiments of a field plate with camera looking through the field plate (A) and through the LED device support substrate (B).

FIG. 11 shows a circuit model used to simulate the $C^2I$ functional test method according to an embodiment.

FIGS. 12A-D show the detailed sequence of the current injection/measurement phase I of an embodiment.

FIGS. 13A-D show the detailed sequence of the current injection/measurement phase III of an embodiment.

FIGS. 14 A-D show a longer time axis (200 msec) showing 4 measurement sequences of an embodiment.

FIG. 19 shows three LED structures A, B and C, in which structure A is a vertical LED structure with top surface area accessing the top contact by top capacitive coupling and the bottom surface area accessing the bottom contact by bottom capacitive coupling, structure B is a lateral MESA-type LED structure with top surface area accessing both the top contact and bottom contact by top capacitive coupling and the bottom surface area accessing the bottom contact by bottom capacitive coupling, and structure C is a lateral MESA-type LED structure with a small top via opening to the bottom contact. Except for differing relative capacitance values, it is electrically similar to structure B.

FIG. 20 shows three different capacitive coupling configurations A, B and C, where configuration A uses a common top field plate electrode, configuration B uses a patterned top field plate electrode only coupling to the top (anode) contact, and configuration C uses a patterned top field plate electrode with separate top (anode) and bottom (cathode) contacts.

FIG. 24A shows an embodiment of the discharge field plate assembly with spatially decreasing voltage as a means of safely discharging the LED structure after the measurement phase.

FIG. 24B shows an embodiment of the discharge field plate assembly with spatially increasing dielectric thickness as a means of safely discharging the LED structure after the measurement phase.

DETAILED DESCRIPTION

Figure 1:
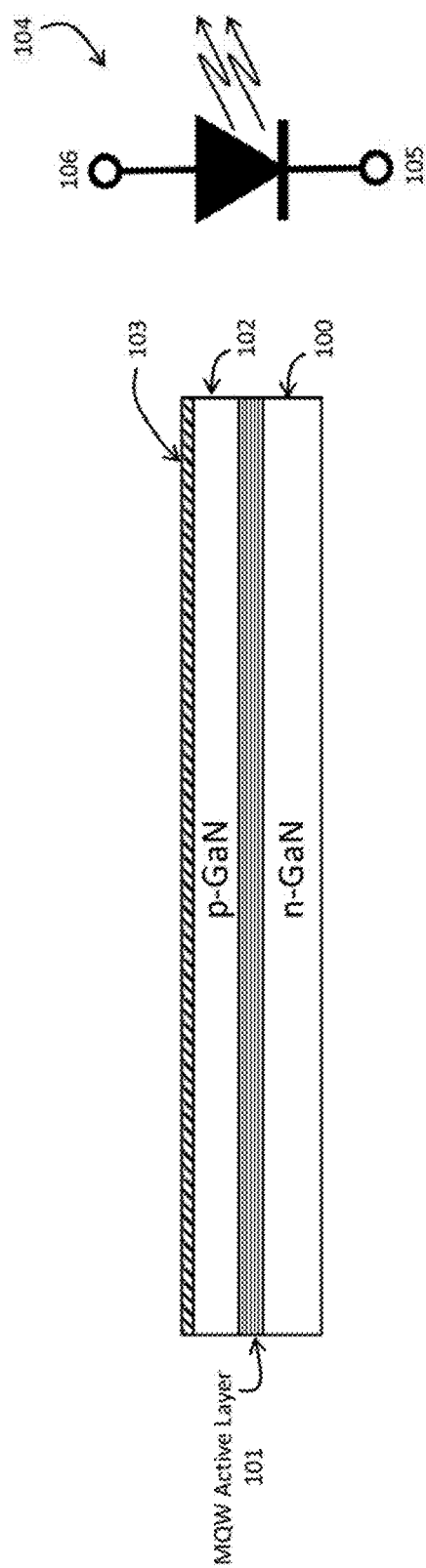
FIG. 1 shows a simplified cross-section of an LED structure.

A further explanation of LEDs is found throughout the present specification and more particularly below. In an example, one type of LED is an organic light emitting diode (OLED) in which the emissive layer of the diode is formed of an organic compound. One advantage of OLEDs is the ability to print the organic emissive layer on flexible substrates. OLEDs have been integrated into thin, flexible displays and are often used to make the displays for portable electronic devices such as cell phones and digital cameras.

Another type of LED is a semiconductor-based LED in which the emissive layer of the diode includes one or more semiconductor-based quantum well layers sandwiched between thicker semiconductor-based cladding layers. Some advantages of semiconductor-based LEDs compared to OLEDs can include increased efficiency and longer lifespan. High luminous efficacy, expressed in lumens per watt (lm/W), is one of the main advantages of semiconductor-based LED lighting, allowing lower energy or power usage compared to other light sources. Luminance (brightness) is the amount of light emitted per unit area of the light source in a given direction and is measured in candela per square meter (cd/m²) and is also commonly referred to as a Nit (nt). Luminance increases with increasing operating current, yet the luminous efficacy is dependent on the current density (A/cm²), increasing initially as current density increases, reaching a maximum and then decreasing due to a phenomenon known as "efficiency droop." Many factors contribute to the luminous efficacy of an LED device, including the ability to internally generate photons, known as internal quantum efficiency (IQE). Internal quantum efficiency is a function of the quality and structure of the LED device. External quantum efficiency (EQE) is defined as the number of photons emitted divided by the number of electrons injected. EQE is a function of IQE and the light extraction efficiency of the LED device. At low operating current density (also called injection current density, or forward current density) the IQE and EQE of an LED device initially increases as operating current density is increased, then begins to tail off as the operating current density is increased in the phenomenon known as the efficiency droop. At low current density, the efficiency is low due to the strong effect of defects or other processes by which electrons and holes recombine without the generation of light, called non-radiative recombination. As those defects become saturated radiative recombination dominates and efficiency increases. An "efficiency droop" or gradual decrease in efficiency begins as the injection-current density surpasses a low value, typically between 1.0 and 10 A/cm².

Semiconductor-based LEDs are commonly found in a variety of applications, including low-power LEDs used as indicators and signage, medium-power LEDs such as for light panels and automotive tail lights, and high-power LEDs such as for solid-state lighting and liquid crystal display (LCD) backlighting. In one application, high-powered semiconductor-based LED lighting devices may commonly operate at 400-1,500 mA, and may exhibit a luminance of greater than 1,000,000 cd/m². High-powered semiconductor-based LED lighting devices typically operate at current densities well to the right of peak efficiency on the efficiency curve characteristic of the LED device. Low-powered semiconductor-based LED indicator and signage applications often exhibit a luminance of approximately 100 cd/m² at operating currents of approximately 20-100 mA. Low-powered semiconductor-based LED lighting devices typically operate at current densities at or to the right of the peak efficiency on the efficiency curve characteristic of the LED device. To provide increased light emission, LED die sizes have been increased, with a 1 mm² die becoming a fairly common size. Larger LED die sizes can result in reduced current density, which in turn may allow for use of higher currents from hundreds of mA to more than an ampere, thereby lessening the effect of the efficiency droop associated with the LED die at these higher currents.

LEDs have been used in portable devices such as watches, smartphones and laptops as well as computer monitors and TV displays for many years however only indirectly as an alternative white light source for Liquid-Crystal Display (LCD) display technologies. These were called "LED" TVs and the like, but the actual LEDs were predominantly GaN-based white LEDs to illuminate the backlight in lieu of the cold fluorescent lamp (CFL) backlight sources used before. The color pixel generation continued to be based on LCD technology that worked by a light subtraction process where colors are generated by blocking other colors using an intervening color filter. For example, a red pixel would be generated by a red color filter that blocked the green and blue portion of the backlight LED white spectrum. Grey scale (light intensity of the pixel) occurred by modulating light polarization through a liquid-crystal cell placed between two crossed polarizers along the light path.

Although the LED backlight driven LCD display technology was more efficient and reliable than the CFL backlit version, the technology is still not power efficient. The reason is simple: although the LED white backlight devices can be fairly efficient in terms of external quantum efficiency (photons emitted per electrical carriers injected into the LED device), there are numerous inefficiencies in the rest of this LCD display technology. The first polarizer will cut a little half of the non-polarized white backlight, then each pixel is colorized by subtracting ⅔ of the remaining light (R without GB for red, G without RB for green and B without RG for blue). Other losses include pixel fill factor and film/LCD cell absorption and scattering. The total light output is therefore less than about ⅙ of the white LED backlight intensity.

The trend is for more power efficient and bright display technologies, especially with portable, battery operated devices where battery life is a key factor. Micro-LED is a promising technology for achieving higher power efficiencies. In a micro-LED display, a small LED device placed within a pixel area is directly driven to generate light in a direct emissive manner. Color can be generated either by (i) utilizing UV-LEDs (i.e. GaN-based) with color phosphors to generate the pixel colors by photon down conversion and/or (ii) by using LEDs that generate the color directly (i.e. AlGaAs, GaAsP, AlGaInP, GaP for red, GaP, AlGaInP, AlGaP for green and ZnSe, InGaN, SiC for blue). In either case, the direct emission/direct view of the micro-LED display promises a six-fold improvement or more in power efficiency.

Although the basic technology to realize micro-LED based displays is well known, numerous manufacturing and quality control challenges exist. One of these is functionally testing millions of micro-LED devices within the manufacturing process in a cost-effective and efficient manner before the pixels are committed to use. It is therefore desired to enable functional testing without direct electrical contact and in a manner compatible with micro-LED large-scale manufacturing processes. Further details of the present invention can be found throughout the present specification and more particularly below.

Embodiments of the present invention describe LED device fabrication processes and manners of functionally testing LED devices without direct electrical contact. In particular, some embodiments of the present invention may relate to manners of functionally testing high-brightness LED, medium power LED, low-power LED and micro LED devices.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the features, structures, configurations, or characteristics may be combined in any suitable manner in one or more embodiments.

The terms "spanning", "over", "to", "between" and "on" as used herein may refer to a relative position of one layer with respect to other layers. One layer "spanning," "over" or "on" another layer or bonded "to" or in "contact" with another layer may be directly in contact with the other layer or may have one or more intervening layers. One layer "between" layers may be directly in contact with the layers or may have one or more intervening layers.

Certain embodiments of the invention describe an LED device assembly in which an LED device structure layer is transferred from a support substrate and bonded to a pickup plate assembly before further processing. In accordance with embodiments of the present invention, the $C^2I$ functional testing step can be applied either before the transfer or after one or more transfers. For the purposes of simplifying the various possible configurations wherein the plurality of the LED structures is transferred and possibly bonded onto a different substrate, the target substrate shall be called a support substrate in each case. For example, the substrate that supported the LED structures during MOCVD growth is also called a support substrate, however after release and attachment to a pickup plate, such a plate and any other substrate or plate used to mechanically support the LED device layer will also be called a support substrate. If a pickup plate is used, common electrical contact can be accomplished using an electrically conducting material film between the transferred LED device structures and the rest of the pickup plate. As further described below, the common contact can also be accomplished using a second dielectric layer and optional voltage waveform source. In some cases, the pickup plate material would also have a degree of controllable tackiness to allow LED device pickup and transfer in production. Additionally, the support substrate can be a flexible sheet such as a plastic film and the $C^2I$ can be used to test device structures on individual sheets or as part of a roll-to-roll manufacturing process (for example in an Organic-LED or OLED manufacturing process). The term support substrate will be generally used to connotate its role as mechanical support and will be the substrate described as part of ($C^2I$) functional testing apparatus throughout this description.

Although the embodiments of this invention describe singulated and non-singulated LED device structures, additional electronics such as active-matrix addressing circuitry and support electronics can be present. Applying design for testability approaches and using the general ability of the $C^2I$ functional test methods could successfully test complex interconnected LED structures. For purposes of this invention, specific descriptions of the LED structures shall be taken as merely examples and the test methods is to be understood as generally applicable to test singulated, non-singulated, lateral and vertical LED structures with or without integrated addressing and other support electronics.

Depending on the specific embodiment of this invention and the point in the manufacturing process $C^2I$ functional testing is made, the support substrate can be transparent and have additional coatings. These either directly support the test process or exist as part of the requirements of the specific LED manufacturing process step as will be described in more detail below.

Referring to FIG. 1, a representative LED 104 comprises of deposited layers that form a n-type cathode layer 100, an active layer (usually a Multi-Quantum Well or MQW series of sub-layers) 101 and a p-type layer 102 and p-contact 103. This LED structure is simplified and many additional layers such a buffer layers, blocking layers, n-contact layer(s) and the like are not shown for simplicity. Electrically, the LED would be contacted through layer 103 (or contact 106) as the anode and through layer 100 (or contact 105) as the cathode. In some LED structures, the n and p layers can also be contact layers and thus can be named interchangeably for purposes of this invention unless specifically described otherwise. Passing current through the LED device using a forward (positive voltage) bias from anode to cathode would generate light from radiative recombination processes from carriers flowing through the active region. The design of the active layer 101 is optimized for maximizing radiative recombination processes that emit light. Reverse biasing the LED structure will not generate light. Limiting reverse bias voltage is important with LEDs to avoid damaging or destroying the device through a process called breakdown. Within a safe reverse bias region, small leakage currents flow through the device.

Figure 2:
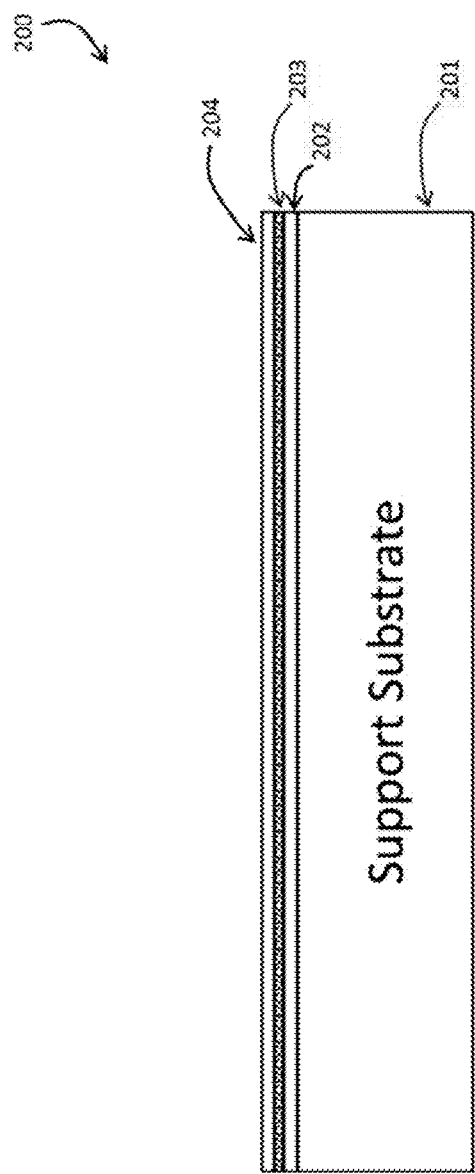
FIG. 2 shows an LED support substrate containing LED device structures within an LED mass-production process.

In LED manufacturing, the LED devices are made in mass-production using methods similar to substrate-based mass-production processes common in the semiconductor industry. Referring to FIG. 2, the LED structure described in FIG. 1 is deposited onto a suitable growth or support substrate 201 to make an LED substrate 200. Depending on the type, quality and color of the LED desired, different substrate material types can be used. Examples are GaP, GaAs, GaN substrates or heteroepitaxial growth substrates such as sapphire and silicon carbide (SiC) are also possible. Layer-transferred semiconductor layered template substrates are yet another type of growth substrate. The LED structure is then growth to develop a lower contact 202 (n-type or cathode in this example), active region 203 and upper contact 204 (p-type or anode in this example).

Figure 3B:
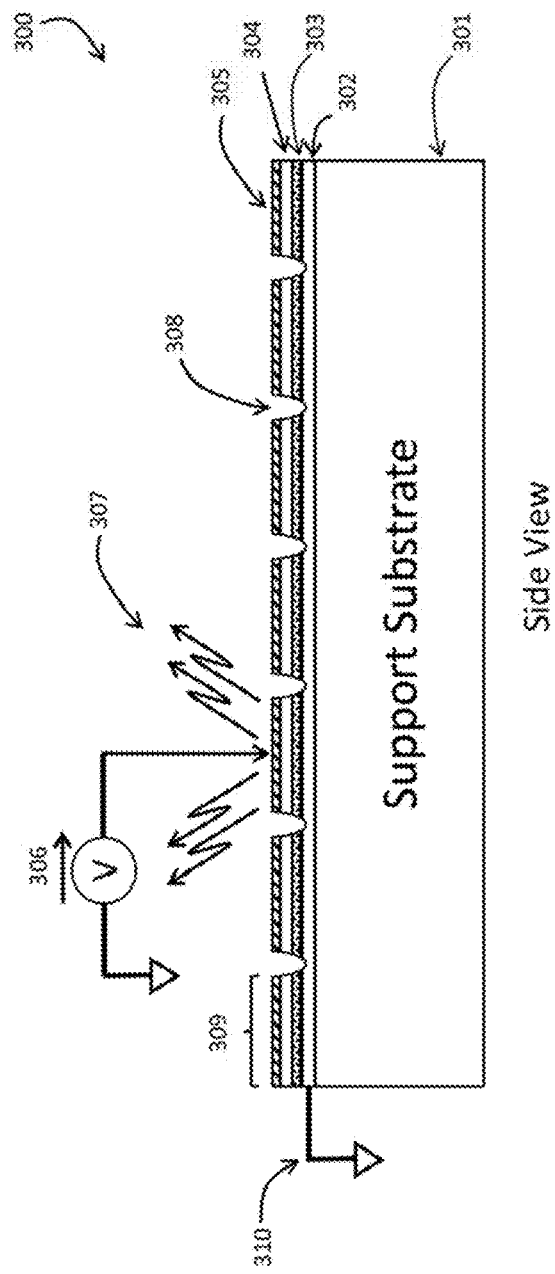
FIGS. 3A-B show a top view (A) and a cross-sectional view (B) of a LED support substrate with singulated LED devices isolated by streets.
Figure 3A:
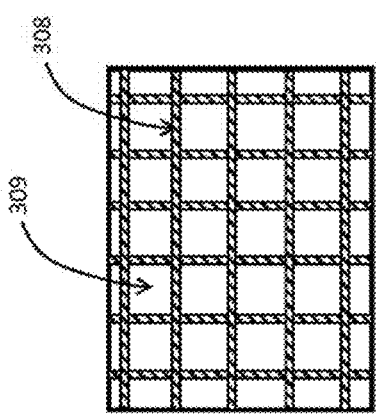

The LED substrate of FIG. 2 contains multiple, non-singulated LED structures. Isolation of individual LED devices of the desired size and function can be made within the LED manufacturing sequence using process steps such as etching, lithography, passivation and deposition. Referring to FIGS. 3A and 3B, the desired LED devices can be isolated while residing on support substrate 301 using processes such as etching to form for example a trench 308. If these etch structures (sometimes called "streets") are made over the substrate to form individually isolated structures such as square devices, a high number of LED devices 309 are electrically isolated and available for release and packaging. In this example, the trench 308 does not etch through the bottom common contact layer 302 and can thus be connected to a common potential 310. Each LED device 309 can thus be individually contacted using a voltage source 306 to the p-layer 304 and p-contact layer 305. Light 307 can then be measured from the contacted device to evaluate its functionality. In this example, a top emitting LED structure is shown where the top contact 305 could be a transparent electrode such as Indium Tin Oxide (ITO). Other structures are possible such as a bottom emitting structure. In this case, the support structure would be preferably transparent and the p-contact layer would be a light reflecting layer such as a metal layer. The LED would thus be tested by measuring the light escaping from the support substrate. Although the above was described as preferred embodiments to maximize the light capture, it would be possible to measure indirectly scattered or reflected light from LEDs even if the light measurement was done, for example, above the LED in a bottom emitting LED structure. Of course, there can be other variations, modifications, and alternatives.

Figure 4:
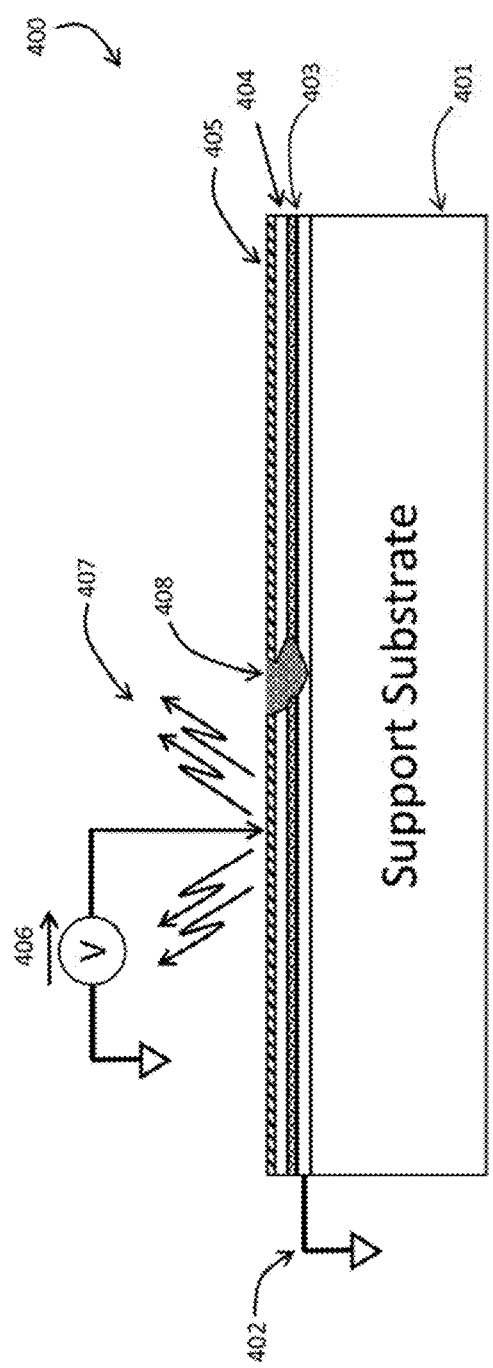
FIG. 4 shows the LED support substrate with a non-singulated LED device structure with the top contact layer having sufficiently high sheet resistance to allow current injection functional test in the presence of adjacent shorts.

FIG. 4 shows a support substrate 401 where the LED devices are still not isolated. If the top contact layer 405 has a limited conductivity (such as an ITO layer with a relatively high film sheet resistivity), functional testing could still be accomplished despite a short 408 present nearby. Contacting a point on the surface using a voltage source 406 would develop a current through the top contact 405, p-layer 404, active layer 403, n-layer 403 to common contact 402. The relatively high resistance to the neighboring short 408 could allow light emission 407 to occur. Using a field plate in lieu of this direct contact example according to an embodiment of this invention would allow non-singulated LED layer testing. Dark (non-emissive) or weakly emissive areas would be an indicator of LED layer functional yield at an early stage of the LED manufacturing process. The efficacy and spatial resolution of this alternative embodiment would be a function of top layer sheet resistivity.

There is therefore a need to inject a current to excite individual LED devices or LED areas such as described in FIGS. 3 & 4 in a manner that can support large-scale manufacturing.

Figures 5A, 5B:
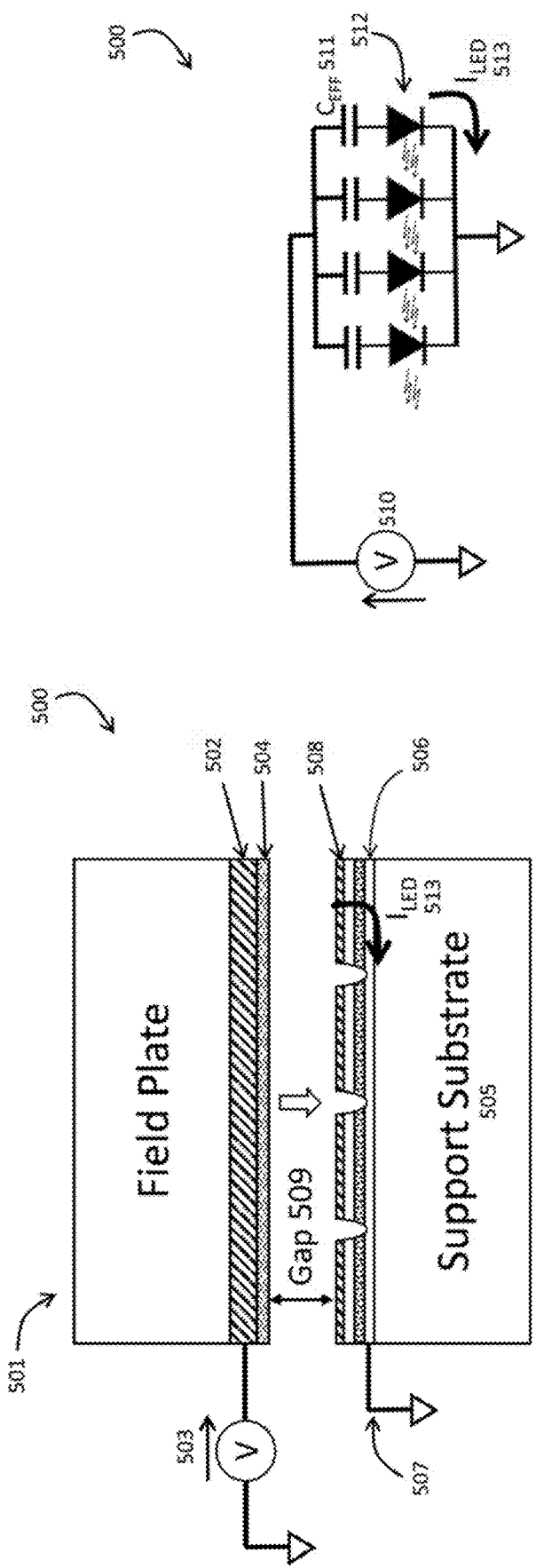
FIG. 5A shows an embodiment of a field plate in close proximity to a portion of an LED device layer containing 4 LED devices on a support substrate.
FIG. 5B shows the corresponding equivalent electrical circuit of the embodiment of FIG. 5A.

The invention has as its current injection device a field plate comprising of 3 elements: a mechanical support plate, an electrode and a dielectric layer. Referring to FIG. 5A, the field plate 501 comprises of a field plate support (top), electrode layer 502 connected to a voltage source 503 and adjacent to one face of dielectric layer 504. The mechanical support plate can also be electrically conductive and only require a dielectric layer. Of course, there can be other variations, modifications, and alternatives.

The field plate electrode would be connected to voltage source 503 and the open face of the dielectric layer 504 would form a capacitance per unit area of:

$$C'_{FP} = \varepsilon_{ox}\varepsilon_r/t_d \quad (1)$$

Where $C'_{FP}$ is the capacitance per unit area of the field plate (F/cm$^2$)

$\varepsilon_o$ is vacuum permittivity (8.854×10$^{-14}$ F/cm)

$\varepsilon_r$ is the relative permittivity of the dielectric layer (dimensionless)

$t_d$ is the dielectric layer thickness (cm)

In an example, important material characteristics of the dielectric layer material includes dielectric constant, dielectric breakdown strength, resistivity, and optical transmissivity. For capacitive coupled configurations, readily deposited dielectrics such as silicon dioxide, silicon nitride and alumina (Al$_2$O$_3$) are of particular interest. If a DC test configuration is desired, a dielectric having limited current leakage would allow DC biasing if coupled to the device using an appropriate gap medium also having limited resistivity. In such a configuration, the field plate dielectric can be optional where the field plate voltage can now be directly coupled to the LED devices through the gap medium. Of course, there can be other variations, modifications, and alternatives.

Again referring to FIG. 5A, the field plate 501 would be placed sufficiently near LED support structure 505 with an n-contact bottom electrode 506 connected to a common contact 507 and a plurality of p-contact top electrodes 508. Although the voltage across each LED device is shown in this description as being developed using a voltage source 503 and common contact 507, the voltage source can be alternatively connected to the bottom or two voltage sources can be connected, one to each of contacts 503 and 507. The effective LED device drive voltage would be the voltage difference between contacts 503 and 507 for all voltage source configurations. For this invention, the term "close proximity" shall mean the open face of the field plate dielectric layer 504 is placed in sufficient proximity to the open face of the LED structure contact surface 508 to allow a desired electrical coupling between the voltage source 503 to the top LED electrode surface 508. In FIG. 5A, this gap is shown as 509 and can be minimal with a limited gap or no gap. Gap 509 should be small enough to allow sufficient capacitive coupling (for optimizing the current injection efficiency) and to minimize spatially defocusing the current injection effect. For top plate 501 with a relatively thick dielectric layer 504 and higher voltage levels on voltage source 503, a limited gap 509 is possible to allow non-contact testing without significantly lowering coupling efficiency ($C_{EFF}' \sim C_{FP}'$). For the rest of this description, gap 509 will be assumed to be zero and thus $C'_{EFF}$ will be made equal to $C'_{FP}$.

The electrical analogue of the structure made by assembly 500 is shown in FIG. 5B. Voltage source 510 (503 in FIG. 5A) is connected to an effective capacitor $C_{EFF}$ 511 connected to LED device 512 having a top surface area $A_{EFF}$. A voltage change will impress a current $I_{LED}$ onto LED device 512. For this example, isolation of LED devices with a common bottom contact is assumed. The effective capacitance $C_{EFF}$ is simply the series capacitance of the field plate dielectric layer with the capacitance of gap 509, both of area $A_{EFF}$:

$$C'_{gap} = \varepsilon_{ox}\varepsilon_r/t_{gap} \quad (2)$$

Where
C'$_{gap}$ is the capacitance per unit area of the gap (F/cm$^2$)
ε$_o$ is vacuum permittivity (8.854×10$^{-14}$ F/cm)
ε$_r$ is the relative permittivity of the gap medium (dimensionless)
t$_{gap}$ is the gap thickness (cm)
and $$C_{EFF} = A_{EFF} \times (C'_{FP} \times C'_{gap})/(C'_{FP} + C'_{gap}) \quad (3)$$

$$C'_{EFF} = (C'_{FP} \times C'_{gap})/(C'_{FP} + C'_{gap}) \quad (4)$$

Where
C$_{EFF}$ is the effective LED device coupling capacitance (F)
C'$_{EFF}$ is the effective LED device coupling capacitance per unit area (F/cm$^2$)
A$_{EFF}$ is the effective LED device area (cm$^2$)
For the rest of this description, gap 509 will be assumed to be zero and thus C'$_{EFF}$ will be made equal to C'$_{FP}$.

The current I$_{LED}$ 513 and current density J$_{LED}$ are readily calculated as:

$$I_{LED} = C_{EFF} \times dV/dt \quad (5)$$

$$J_{LED} = C'_{EFF} \times dV/dt \quad (6)$$

Where dV/dt is the voltage rate of change between the voltage source 510 and the common electrode 507 in FIG. 5A (or the cathode contact in FIG. 5B). For this particular embodiment, LED 512 is connected anode to cathode however cathode to anode injection is possible by reversing all voltage polarities.

FIGS. 6A and 6B show the voltage and current waveforms that would form a measurement sequence according to a preferred embodiment of this invention. There are at least 2 phases in the measurement sequence, the current injection phase I (at time t$_0$ to t$_1$) and the discharge phase III (at time t$_2$ to t$_3$). A voltage holding phase II has been added to allow for enough time for the camera integration window to close before phase III commences however this can be very short and may not be necessary. The phases are described in more detail below and assumes null voltage at all point before t$_0$.

Referring to FIG. 6A, a voltage source-time plot 600 shows the voltage source waveform. At time t$_0$, phase I begins with a positive ramp dV/dt|$_1$ from 0 to V$_1$ from time t$_0$ to t$_1$. This ramp will inject a current I$_{LED}$ into a LED of area A$_{EFF}$ according to equation (5) and a corresponding current density J$_{LED}$ according to equation 6. At time t$_1$, the voltage is held at this voltage V$_1$ until time t$_2$. From time t$_2$ to t$_3$, the voltage is lowered back to a zero-voltage state using a negative ramp dV/dt|$_2$. At time t$_3$, another measurement sequence can then commence.

FIG. 6B shows the corresponding current I$_{LED}$ waveform during the measurement sequence from the driving waveform of FIG. 6A. During phase I, a near constant I$_{LED}$ current will flow through the LED device according to equation (5). Light 602 will be emitted during Phase I. During Phase II, I$_{LED}$ and light emission will drop to 0. To measure the light output of a particular LED device among a plurality of devices simultaneously being excited by the field plate, an integrating camera that can capture the light from one or more LED devices is used. Image processing can generate a value proportional to specific LED devices located within the camera's field of view. This value would be in turn proportional to the optical energy integrated over phase I. It is therefore desirable to start an image sensor integrating time period from a point slightly before t$_0$ to an end point slightly after t$_1$. This will ensure the camera integrating sensor will capture the complete light pulse emanating from the LED structures during phase I.

FIGS. 7A and 7B show two embodiments of the invention. The figures show top and bottom camera placement that can intercept at least a portion of the plurality of LED devices being excited by the measurement sequence through the field plate. Referring to FIG. 7A, a test configuration 700 is shown with a transparent field plate assembly 702 including a field plate electrode 703 and dielectric layer 704. Electrode 703 is connected to a voltage source 705. This assembly is placed in close proximity to the LED device support substrate 701 supporting a plurality of LED device 707 connected to a common contact 706. A camera 708 is placed above the field plate assembly 702 to perform the functional test. FIG. 7B shows an alternative test configuration 709 where the camera is placed below the support substrate. In this configuration, the support substrate and intermediate layers to the LED device structures must be transparent to allow the light to reach the camera.

Optical power generated by an LED is related to electrical power flowing through the LED by the external quantum efficiency η$_{EXT}$ or P$_{opt}$=η$_{EXT}$×P$_{elec}$. The parameter η$_{EXT}$ is in turn quite sensitive to the current density and other device characteristics such as light extraction efficiency. The optical power of an LED device is thus related to electrical power as:

$$P_{opt} = \eta_{EXT} \times P_{elec} = \eta_{EXT} \times I_{LED} \times V_F = \eta_{EXT} \times C_{EFF} \times dV/dt \times V_F \quad (7)$$

Where
P$_{opt}$=LED optical power (W)
η$_{EXT}$=LED external quantum efficiency
V$_F$=LED forward voltage drop (V)
Over a time period Δt=t$_1$−t$_0$ (phase I):

$$E_{opt} = \eta_{EXT} \times C_{EFF} \times dV/dt \times V_F \times \Delta t \quad (8)$$

Where
E$_{opt}$=LED optical energy emitted during phase 1 (J)

According to equation 8, the integrating camera will measure a value proportional to each measured LED's external quantum efficiency. Changing the voltage ramp value will have the effect of selecting a different current density according to equation 6. By plotting Eopt as a function of ramp value to V$_1$, a plot of light energy (related to η$_{EXT}$) as a function of J$_{LED}$ can be generated. This capability can be particularly useful to measure low current density performance of micro-LED devices. Micro-LED devices are typically driven at very low values of 0.001-1 A/cm$^2$ and are more sensitive to drop in external quantum efficiency at these low levels due to non-radiative recombination processes.

During phase III, a negative dV/dt ramp allows the voltages to be returned to zero to reset the system for another measurement. During this phase, the LEDs will be reverse biased and will discharge C$_{EFF}$ using reverse bias leakage current. So as not to reverse bias the LEDs to a voltage level that can cause damage, the negative voltage ramp must be sufficiently slow to keep all devices within a safe reverse bias voltage range. Such a range can be selected depending on the type and design of the LEDs to be tested. As merely an example, reverse bias leakage current density for GaInN LEDs can be estimated using a paper entitled "Transport mechanism analysis of the reverse leakage current in GaInN light-emitting diodes", Q. Shan & al., Applied Physics Letter 99, 253506 (2011). FIG. 2 shows a −5V reverse bias leakage current of approximately 1.5×10$^{-7}$ A on a 1 mm$^2$ LED device at room-temperature. This corresponds to 15 μA/cm$^2$.

This reverse bias leakage current density will be used to calculate values and parameters for specific C²I examples described below.

Suitable integrating cameras must satisfy the following criteria:
  a. Pixel sensitivity and dynamic range (allows LEDs to be accurately measured through the operating range of interest without excessive dark noise and signal saturation).
  b. High pixel density and frame rate (increases throughput and parallel LED measurement).
  c. Global shutter and flexible triggering (all pixels must be triggered and integrate in over the same time period).

One example of an industrial camera meeting these criteria is model GS3-U3-23S6M-C from PointGrey Research Inc., Richmond, BC, Canada. The camera is a 2.3 megapixel (1920×1200) monochromatic camera with global shutter, 5 μsec to 31.9 sec exposure range, over 160 frames per second rate, 1/1.2" sensor format, 12-bit digitization, 5.86 μm pixel size, 72 dB dynamic range, 76% quantum efficiency (525 nm), an e− saturation capacity of about 32,000 electrons and temporal dark noise of about 7 e−. Used singly or in a matrix arrangement where n×m cameras would be used to measure a larger field plate area simultaneously, the camera will have the capability to measure numerous LED devices with the requisite accuracy.

For the following examples, a field plate with a 3 μm silicon dioxide dielectric layer is assumed ($\varepsilon_r$=3.9). This dielectric material is commonly used and can be sputtered, grown or deposited on numerous materials. The thickness was selected to be sufficiently thin to allow testing of micro-LED devices down to 10 μm×10 μm or less and can support a voltage exceeding about 1500 volts before breakdown. $C'_{FP}$ would be 1.15 nF/cm².

A value for $V_1$ of 500V is assumed (see FIG. 6A). With these assumptions and parameter selections, the light pulse energy per LED can be simplified as:

$$E_{opt} = \eta_{EXT} \times C_{EFF} \times \Delta V \times V_F \quad (9)$$

Figure 8:
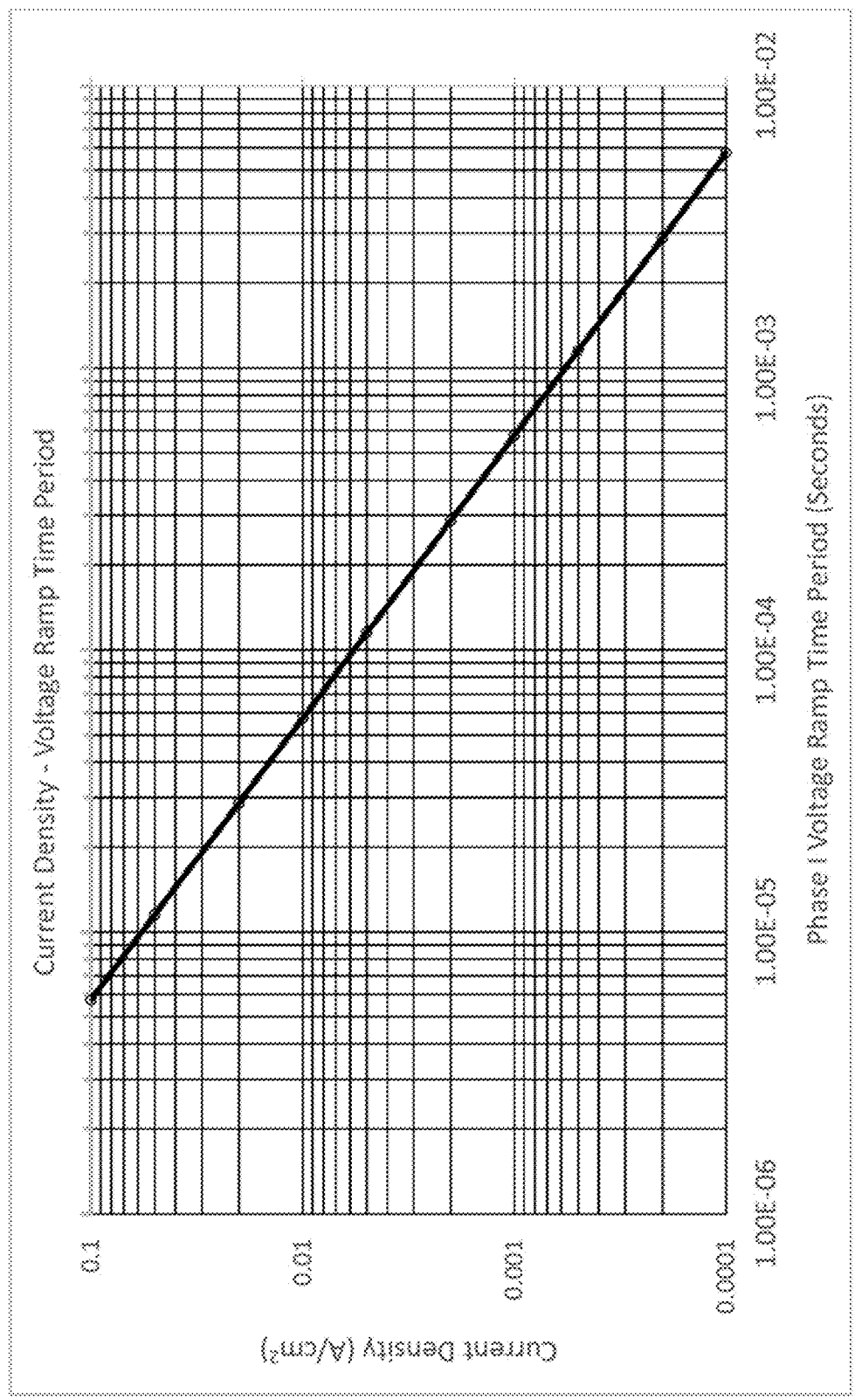
FIG. 8 shows the expected current density (A/cm2) versus dV/dT voltage ramp of a preferred embodiment.

For the parameters selected, FIG. 8 shows the current density selected for a voltage ramp time period. For example, the LED would be driven at 0.01 A/cm² if the field plate voltage was driven from zero to +500 Volts in approximately 60 μsec (phase I). The camera shutter would be opened slightly before the ramp begins (for example, 10-50 μsec before $t_0$) and would be opened slightly after the end of phase I (for example, 10-50 μsec after $t_1$). Apart from ensuring that the phase I LED light pulse is fully integrated within the camera shutter time window, excessive integration time should be avoided as this will tend to raise the noise floor of the camera. Phase II can be selected to end just as the integrating shutter closes.

To safely recover during phase III, equation 6 is utilized with the current density selected to be approximately equal to the leakage current density. For example, utilizing a target leakage current density of 10 μA/cm² (a little lower than the expected leakage of 15 μA/cm²) and ΔV=500V, equation 6 predicts a minimum Δt of almost 60 msec. This corresponds to a measurement repetition rate of about 16 frames per seconds for injection current densities of 0.0005 A/cm² or above.

Faster recovery rates are possible using an external light source illuminating the LED device area at a sufficiently short wavelength to excite carriers within the LED device junction. The enhanced photocurrent leakage would allow faster phase III recovery without developing high reverse bias conditions.

To estimate the signal achievable with this measurement approach and the area covered by one camera, the following additional parameters are assumed:
  a. GaN LED (about 410 nm emission & 65% camera quantum efficiency)
  b. $V_F$ about 3V
  c. $E_{opt}$=170 nJ/cm2 ($\eta_{EXT}$~10%)

At about 3 eV per photon, approximately 3.5×10¹¹ photons/cm² are emitted during phase I. The number of corresponding photo-electrons that can be generated within the camera would be 0.65×3.5×10¹¹ photons/cm² or 2.3×10¹¹ photo-electrons/cm² (assuming sensor to field plate 1:1 magnification and 100% collection efficiency). At this magnification, a 5.86 μm pixel size would still capture over 78,000 electrons, more than twice the pixel saturation capacity. A lower $V_1$ voltage could be selected if a lower integrated photo-electron count per camera pixel is desired.

Using a 0.5× collection lens (model #62-911 TECHSPEC™ large format telecentric lens manufactured by Edmund Optics, Barrington, N.J., USA) as an example, a roughly 21 mm×16 mm LED substrate area will be imaged onto the image sensor, although there can be variations. The working distance is 175 mm and the entrance aperture is roughly 90 mm, resulting in about 1.7% total collection efficiency compared to 4π sr. The expected photo-electrons collected would be 2.3×10¹¹ photo-electrons/cm²×(5.86 μm×2)²×0.017=5.3 ke⁻/pixel. This is well within the sensor's dynamic range and signal averaging or increasing $V_1$ could further improve signal quality if desired. Of course, there can be other variations, modifications, and alternatives.

The imaging of the field plate to the camera sensor area is thus less a function of the available signal than the number of pixels allocated per LED device. For a larger LED device measuring 250 μm on a side, less magnification is necessary. Assuming a 2×2 pixel area to cover each LED device for accurate metrology, one camera could measure 960×600 LED devices, 240 mm×150 mm field plate area or more than the area of a 6" support substrate. In this example, $V_1$ could be reduced to less than 100V and perhaps lower while still maintaining excellent signal to noise ratio. If the light pulse energy is too high, a neutral density filter or other absorption filter can be placed between the emitting surface and the camera to avoid camera saturation.

For a micro-LED application with 10 μm×10 μm LED device size, the same 960×600 LED devices per sensor would be measured or about 9.6 mm×6 mm field plate area. A step and repeat system with approximately 16×25 steps would allow testing of a 6" micro-LED substrate containing over 170 million devices. If a single measurement per LED device is sufficient, a synchronized image capture with a moving camera or cameras could decrease test time to less than 1 minute or even a few seconds. For example, a 16 frame per second capture rate would allow a full 6" substrate to be functionally tested in about 25 seconds. That would correspond to over 9 million LED devices tested per second, far faster than probe cards and individual test methods.

Figure 9:
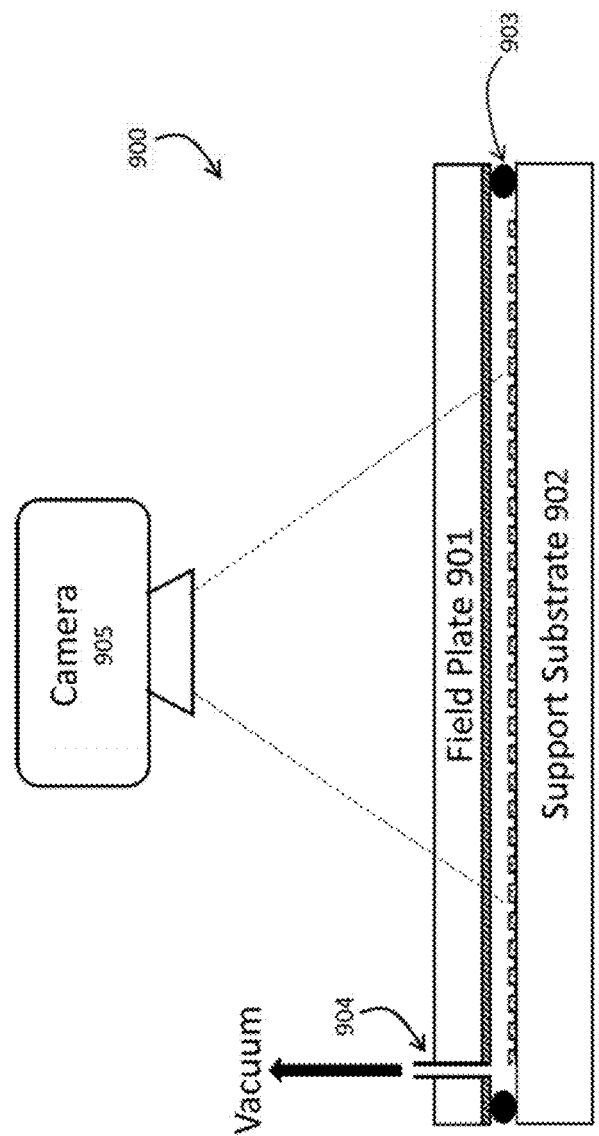
FIG. 9 shows a substrate scale method to attach the field plate onto a support substrate containing LED device structures using vacuum developed in the space between the field plate and the support substrate.

In a preferred embodiment, FIG. 9 shows a substrate-sized field plate can be attached to a support substrate using vacuum to make an assembly 900 suitable for functional test. The field plate 901 is placed on the LED device support substrate 902 with a compliant vacuum seal 903 placed on the outside peripheral area to maintain a level of vacuum between the field plate and the LED device support substrate. The air is then evacuated in the space between the plates using vacuum port 904. The plates would be pressed together at up to atmospheric pressure to minimize the gap in a uniform manner, thus optimizing the effective field plate coupling capacitance $C_{EFF}$. A support substrate exchange mechanism could exchange substrates to be tested under the field plate by cycling port 904 between vacuum and vent conditions. A camera 905 that measures above the field plate is shown in this embodiment. Instead of vacuum, a fill and evacuation port can supply a suitable liquid coupling medium within the gap. Of course, there can be other variations, modifications, and alternatives.

Figure 10:
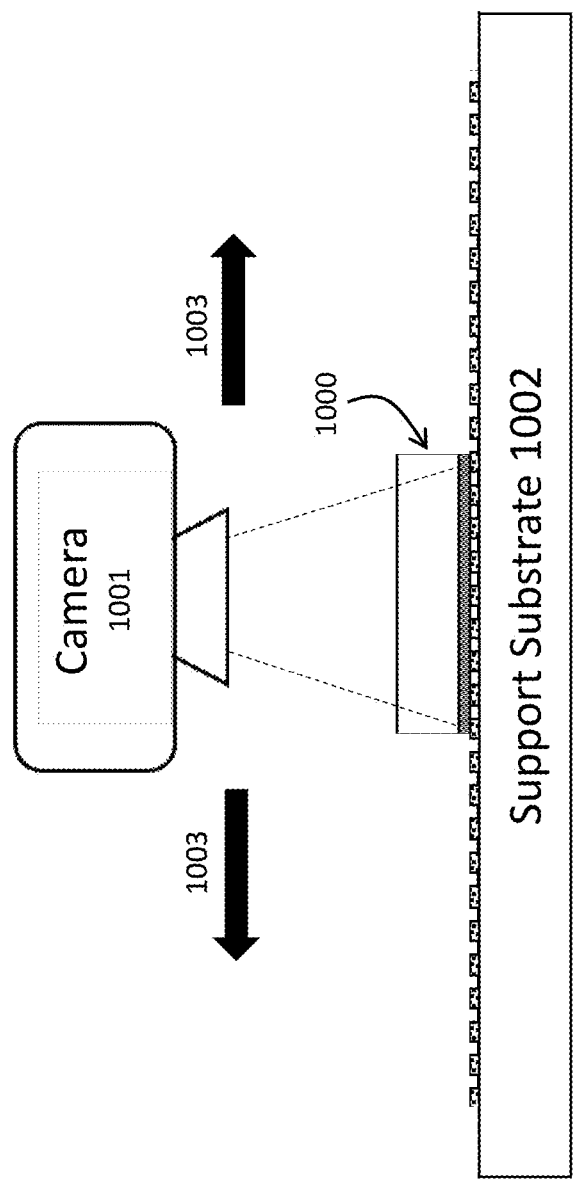
FIG. 10 shows a smaller field plate & camera optical system in a step/repeat mechanical configuration.

In another embodiment, FIG. 10 shows an assembly comprising of a smaller field plate 1000 and camera 1001 placed above an LED device support substrate 1002. The field plate/camera assembly is moved in successive move/measure steps 1003 to measure the complete substrate 1002. Of course, there can be other variations, modifications, and alternatives.

Electrical simulations of the measurements sequence showing the main phase 1 and 3 waveforms are shown in FIGS. 11-14. The system being simulated is as follows:
1. Field plate: 3 μm silicon dioxide, $C'_{EFF}$=1.15 nF/cm2
2. 10 μm×10 μm LED device size: 1.15 fF $C_{EFF}$, 15 pA reverse leakage current
3. 0.01 A/cm² current density test point
4. $V_1$=500V (60 μsec ramp time to achieve 0.01 A/cm² current density injection)
5. 60 msec measurement repetition rate
6. LED device is a standard diode capable of reverse leakage current of about 10 pA The program used is a SPICE circuit simulator called Micro-Cap version 11 from Spectrum Software (Sunnyvale, Calif.). One 10 μm×10 μm LED device was simulated under the above conditions. FIG. 11 shows the circuit diagram where $C_{EFF}$=1.15 fF driven by a voltage generator V2. This generator was programmed to ramp from 0 to +500V in 60 μsec followed by a 60 msec ramp down from +500V to 0V. Voltage source V3 is unconnected but was programmed to show an example of a desired camera shutter window. In this example, the shutter is opened 10 μsec before phase I and closes 10 μsec after phase I.

FIGS. 12A-D show the Phase 1 waveforms with the voltage source V2 (FIG. 12A), LED device forward bias (FIG. 12B), LED device forward current (FIG. 12C) and the camera shutter control signal from voltage source V3 (FIG. 12D). Referring to FIG. 12D, the camera integrator shutter opens 10 μsec before the start of the voltage (at time +10 μsec on the time axis). At time +20 μsec on the time axis, the voltage source starts to ramp towards +500V (time $t_0$). During this phase I until time +80 μsec, the LED device is biased at +10 nA (FIG. 12C) at a forward bias of approximately +250 mV (FIG. 12B). This corresponds to 0.01 A/cm² current density as desired. After time +80 μsec, the voltage ramp stops and the LED current drops to zero. At time +90 μsec, the camera shutter closes, completing its integration of the light pulse that was generated during phase I. The voltage source will now start a slow discharge at a target leakage current of −10 pA. FIGS. 13A-D show the same voltage and current points during the phase III discharge lasting about 60 msec. FIG. 13C shows a −10 pA discharge current that allows $C_{EFF}$ to discharge over 60 msec from +500V to 0V safely. After the voltage source is returned to zero at about +60 msec, a new measurement sequence is initiated. FIGS. 14A-D show a longer time axis (200 msec) showing 4 measurement sequences.

A direct common contact also allows DC biasing and functional testing configurations. FIG. 15 shows an embodiment where the LED devices can be biased in a DC mode only or in combination with a time varying AC mode. Referring to FIG. 15A, the field plate 1501 comprises of a field plate support (top), electrode layer 1502 connected to a voltage source 1503 and adjacent to one face of an optional "leaky" dielectric layer 1504. The mechanical support plate can also be electrically conductive and only require the optional "leaky" dielectric layer 1504. Of course, there can be other variations, modifications, and alternatives.

The field plate electrode is connected to voltage source 1503 and the open face of the optional "leaky" dielectric layer 1504 form a capacitance per unit area of:

$$C'_{FP} = \varepsilon_{ox}\varepsilon_r/t_d \tag{10}$$

Where
$C'_{FP}$ is the capacitance per unit area of the field plate (F/cm²)
$\varepsilon_o$ is vacuum permittivity (8.854×10⁻¹⁴ F/cm)
$\varepsilon_r$ is the relative permittivity of the dielectric layer (dimensionless)
$t_d$ is the dielectric layer thickness (cm)
The dielectric would have a resistivity of $\rho_d$, selected to allow the desired biasing of the LED devices in a DC bias configuration. The time constant driving the bias response time is $\varepsilon_o \times \varepsilon_r \times \rho_d$. The effective resistance can be calculated as follows:

$$R'_{FP} = \rho_d \times t_d \text{ (ohms-cm}^2\text{)} \tag{11}$$

Where
$R'_{FP}$ is the resistance for a unit area of the field plate (ohms-cm²)
$\rho_d$ is the resistivity of the field plate dielectric layer (ohm-cm)
$t_d$ is the dielectric layer thickness (cm)
In an example, the leaky dielectric layer can be generally described as a layer with a reasonably high relative dielectric constant, resistivity on the order of 1 Mohm-cm or higher and a sufficiently high dielectric breakdown field strength. Type II DI (deionized) water meets these criteria with a dielectric constant of 81, resistivity of 1 Mohm-cm and a breakdown field strength exceeding 13 MV/cm. In other examples, the layer can be a slightly conductive doped glass/ceramic, plastic or the like. If a small relative dielectric constant of about 1 is acceptable, an air layer with a voltage within a gap could become slightly conductive by weak ionization to accomplish the function of a "leaky" dielectric layer.

Again referring to FIG. 15A, the field plate 1501 would be placed sufficiently near LED support structure 1505 with an n-contact bottom electrode 1506 connected to a common voltage source 1507 and a plurality of p-contact top electrodes 1508. Although the voltage across each LED device is shown in this description as being developed using a voltage source 1503 and common voltage source 1507, a voltage source can be alternatively connected to either contact 1502 or 1506. The effective LED device drive voltage would be the voltage difference between contacts 1503 and 1507 for all voltage source configurations. For this configuration, the open face of the field plate dielectric layer 1504 or the electrode contact 1502 is placed in sufficient proximity to the open face of the LED structure contact surface 1508 to allow a desired electrical coupling between the voltage source 1503 to the top LED electrode surface 1508. In FIG. 15A, this gap is shown as 1509 and can be minimal with a limited gap. Gap 1509 should be small enough to allow sufficient capacitive and resistive coupling (for optimizing the current injection efficiency) and to minimize spatially defocusing the current injection effect for the selected gap medium.

Figure 15B:
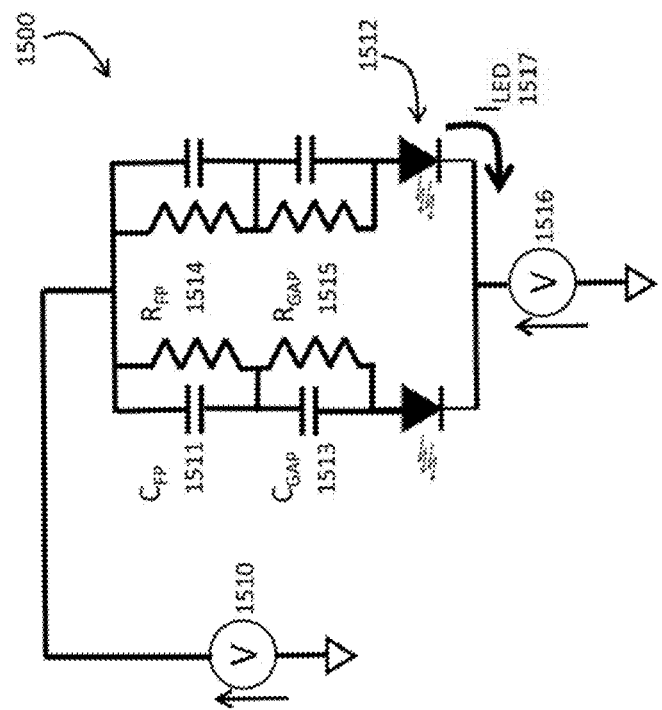
FIG. 15B shows the corresponding equivalent electrical circuit of the embodiment of FIG. 15A.
Figure 15A:
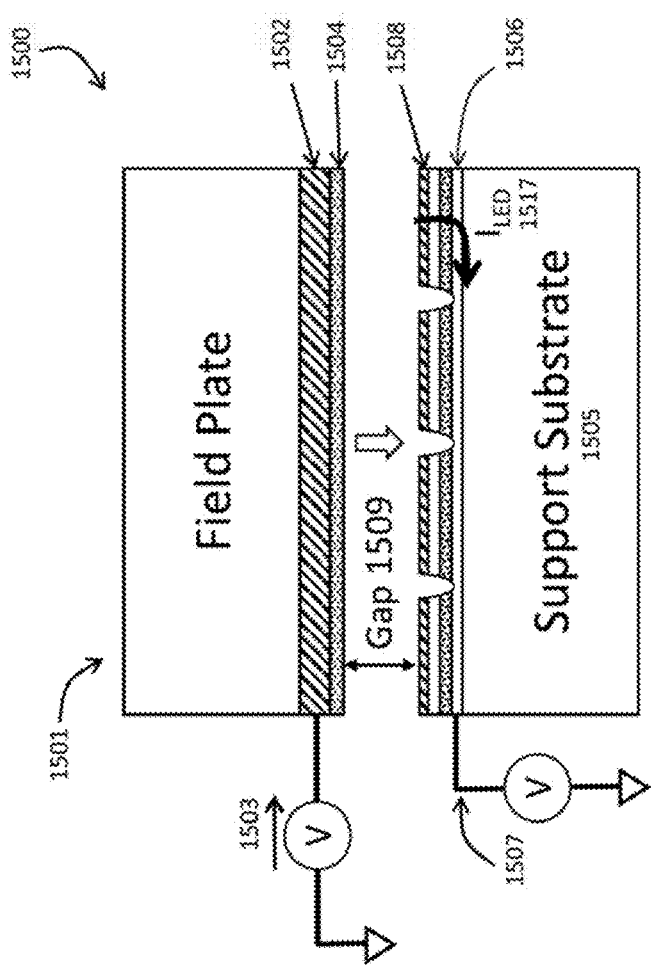
FIG. 15A shows an embodiment of a field plate in close proximity to a portion of a LED device layer containing 4 LED devices on a support substrate with a buried common contact and optional dielectric layer (i.e., "leaky" dielectric layer) and coupling gap medium to allow DC bias functional test.

The electrical analogue of the structure made by assembly 1500 is shown in FIG. 15B. Voltage source 1510 (1503 in FIG. 15A) is connected to each LED device 1512 having a top surface area $A_{EFF}$ through two effective capacitors, one representing the optional "leaky" field plate dielectric 1504 ($C_{FP}$ 1511) and one representing the gap dielectric medium 1509 ($C_{GAP}$ 1513). Each capacitor is shunted by a resistor representing the leakage path through the field plate dielectric $R_{FP}$ 1514 and gap medium $R_{GAP}$ 1515. A voltage source 1516 (1507 in FIG. 15A) connected to the bottom common contact 1506 completes the electrical circuit. A voltage change and level will impress a current $I_{LED}$ 1517 onto LED device 1512. The effective capacitance $C_{EFF}$ is simply the series capacitance of the field plate dielectric layer with the capacitance of gap 1509, both of area $A_{EFF}$:

$$C'_{gap} = \varepsilon_0 \times \varepsilon_r / t_{gap} \quad (12)$$

Where
$C'_{gap}$ is the capacitance per unit area of the gap (F/cm²)
$\varepsilon_o$ is vacuum permittivity (8.854×10⁻¹⁴ F/cm)
$\varepsilon_r$ is the relative permittivity of the gap medium (dimensionless)
$t_{gap}$ is the gap thickness (cm)
and $$C_{EFF} = A_{EFF} \times (C'_{FP} \times C'_{gap})/(C'_{FP} + C'_{gap}) \quad (13)$$

$$C'_{EFF} = (C'_{FP} \times C'_{gap})/(C'_{FP} + C'_{gap}) \quad (14)$$

Where
$C_{EFF}$ is the effective LED device coupling capacitance (F)
$C'_{EFF}$ is the effective LED device coupling capacitance per unit area (F/cm²)
$A_{EFF}$ is the effective LED device area (cm²)
The gap medium shunt resistor is calculated as:

$$R'_{GAP} = \rho_{gap} \times t_{gap} \text{ (ohms-cm}^2\text{)} \quad (15)$$

Where
$R'_{GAP}$ is the resistance for a unit area of the gap medium (ohms-cm²)
$\rho_{gap}$ is the resistivity of the gap layer (ohm-cm)
$t_{gap}$ is the gap layer thickness (cm)
and the effective shunt resistor is calculated as:

$$R_{EFF} = (R'_{FP} + R'_{GAP})/A_{EFF} \quad (16)$$

Figure 16:
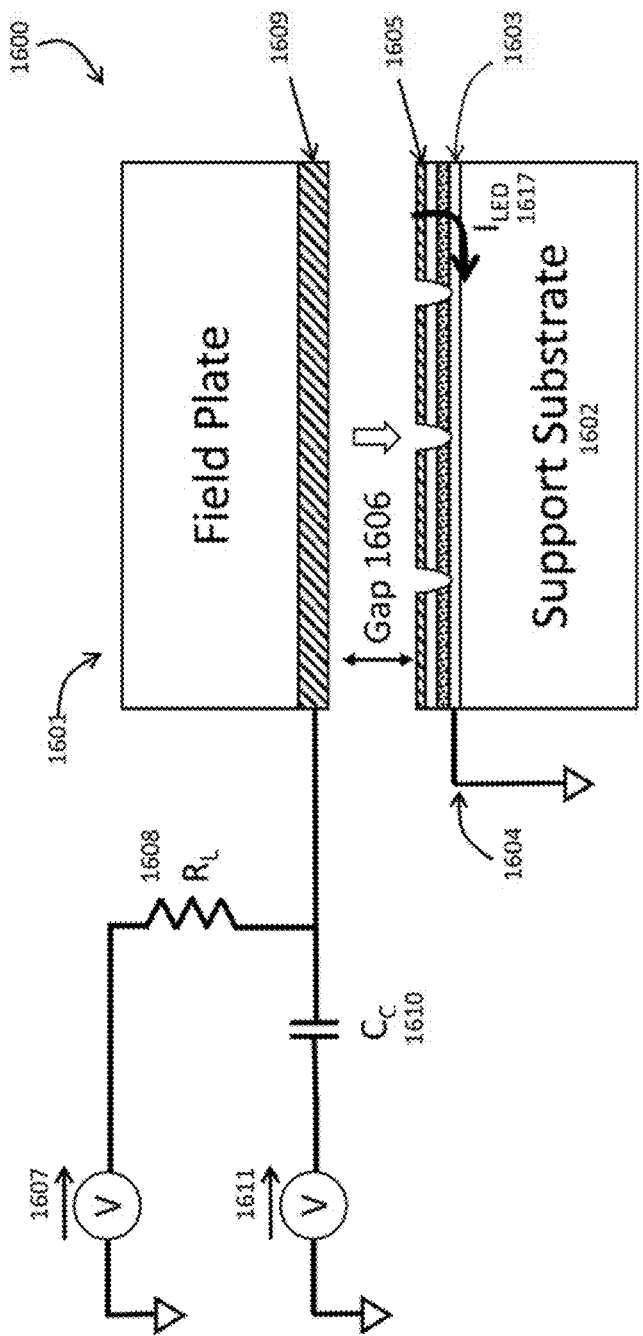
FIG. 16 shows an embodiment of a field plate without a dielectric in close proximity to a portion of a LED device layer containing 4 LED devices on a support substrate with a buried common contact. The configuration using an external load resistor and coupling capacitor and DI water gap medium allows DC bias and AC pulsed functional test.

Where
$R_{EFF}$ is the effective coupling shunt resistance (Ohms)
An example of the DC injection functional test mode is explained here using the structure of FIG. 16. The test configuration is as follows:
1. Device size: 25 µm×25 µm
2. Field plate has no dielectric layer
3. Gap is 25 µm with type II DI water (>1 Mohm-cm)
4. Target DC bias of 10 mA/cm² set by bottom electrode voltage source and bias load resistor $R_L$
5. AC (pulsed) operation driven by the top field plate voltage source through an external coupling capacitor $C_C$
6. Test area 5 cm²

The field plate 1601 is placed sufficiently near LED support structure 1602 with an n-contact bottom electrode 1603 connected to a common ground contact 1604 and a plurality of p-contact top electrodes 1605. For each LED device, the gap medium coupling capacitance is 18 fF and its shunt resistance is 400 Mohm. The relatively large coupling capacitance is made possible using DI water in gap 1606 which has a high relative dielectric constant of 81. The AC and DC components of the injected current within each LED device is denoted by current 1617.

The DC bias is set by adjusting voltage source 1607 to a preset positive potential $V_{pos}$ to bias the LED devices through the load resistor $R_L$ 1608, field plate contact 1609, gap medium 1606, through the LED devices to bottom contact 1604. To achieve the DC bias point of 10 mA/cm², a total current of 50 mA must flow through $R_L$. If $R_L$ is chosen as 100 kohm to allow an efficient coupling of an AC pulse through coupling capacitor $C_C$ 1610 roughly 5 kV positive bias $V_{pos}$ is needed. The voltage drop through the DI water is about 25V while the LED requires 2.5-3.5V to turn on. Note that by varying the bias level, a graph of the output light level versus DC current density bias can be measured. Pulsing the DC bias synchronously with the camera capture time would allow signal averaging and multiple device bias set points to be measured.

A pulsed signal response can be combined by pulsing source 1611 through coupling capacitor 1610. Assuming a $C_L$ of 1 nF, a fast pulse can couple charge into the LED devices before $R_L \times C_C$ relaxation can lower the charge coupling efficiency. For 100 kohm and 1 nF device values, the system relaxation time constant is 100 µsec, a value sufficiently long to ensure that the charge can be transferred to the LED devices and converted to a measurable pulse of light. In this example, the total DI water coupling capacitance is about 14 nF. If a 100 mA/cm² bias is injected for 5 µsec, a total charge of about 3 pC per LED device or 2.4 µC for the test area must be delivered. Since the DI coupling capacitor is about 14 nF, the effective coupling capacitance would still be about 1 nF. The voltage pulse magnitude required of source 1611 would be 2400 volts ramped in 5 µsec. This way, both DC biasing and AC pulsed functional test can be made of an LED device substrate with a bottom common contact. Of course, there can be other bias and pulsing configurations, variations, modifications, and alternatives.

Figure 17B:
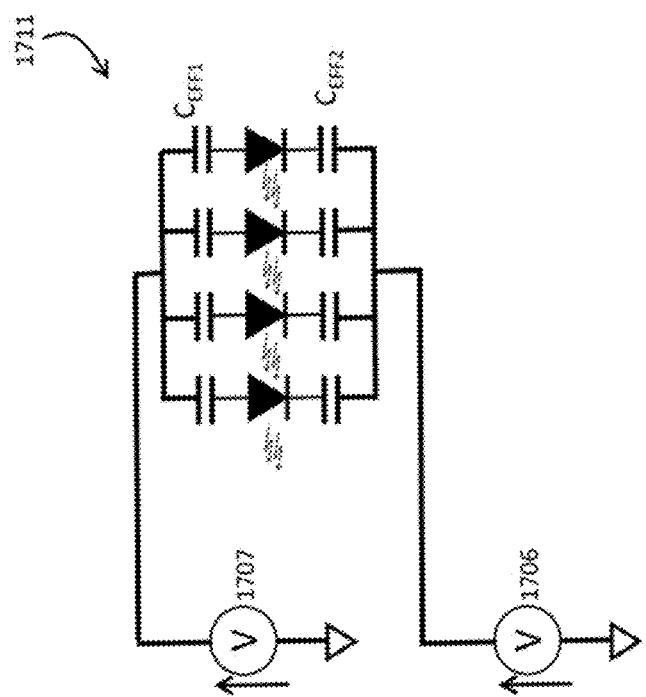
FIG. 17B shows the corresponding equivalent electrical circuit of the embodiment of FIG. 17A.
Figure 17A:
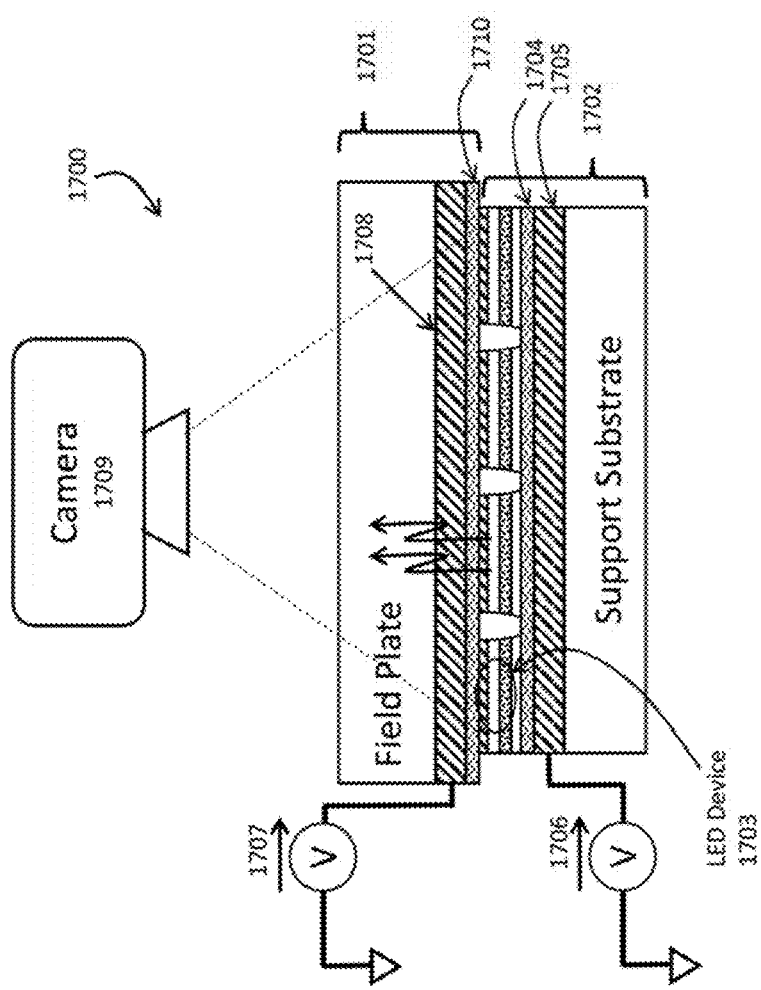
FIG. 17A shows an embodiment of a field plate in close proximity to a portion of a LED device layer containing 4 LED devices on a support substrate with a buried common contact and dielectric layer.

Although this invention has been described with a common contact existing under the LED devices, other device of injecting current are possible. FIG. 17A shows another embodiment 1700 where an analogue to the field plate 1701 is present within support substrate 1702 below the plurality of LED device structures such as LED device 1703. Under the lowest LED device structure layer (the n-layer in examples described in this invention), a dielectric layer 1704 and electrode 1705 completes the support substrate capacitive coupling device. Electrode 1705 is connected to a voltage source 1706. The field plate is connected to a separate voltage source 1707 and field plate electrode 1708. In this example, a camera 1709 is placed above the field plate to capture the light emission response of the plurality of LED devices under test. In this example, the isolation between devices is shown to be complete, however this method would still function with or without full isolation of the n-layer. FIG. 17B shows the equivalent circuit 1711 of this capacitively coupled support substrate configuration. The only change is the insertion of a second coupling capacitor $C_{EFF2}$ below each LED device cathode. The resulting circuit can be made to operate equivalently and be effective in performing C²I functional test. For example, assuming a support substrate dielectric layer 1704 identical to dielectric layer 1710 within the field plate, voltage source 1706 driven identically but negatively to voltage source 1707 (0 to −500V for source 1706 and 0 to +500V for source 1707), the measurement system 1700 would perform essentially identically to a common contact support substrate configuration.

Figure 18:
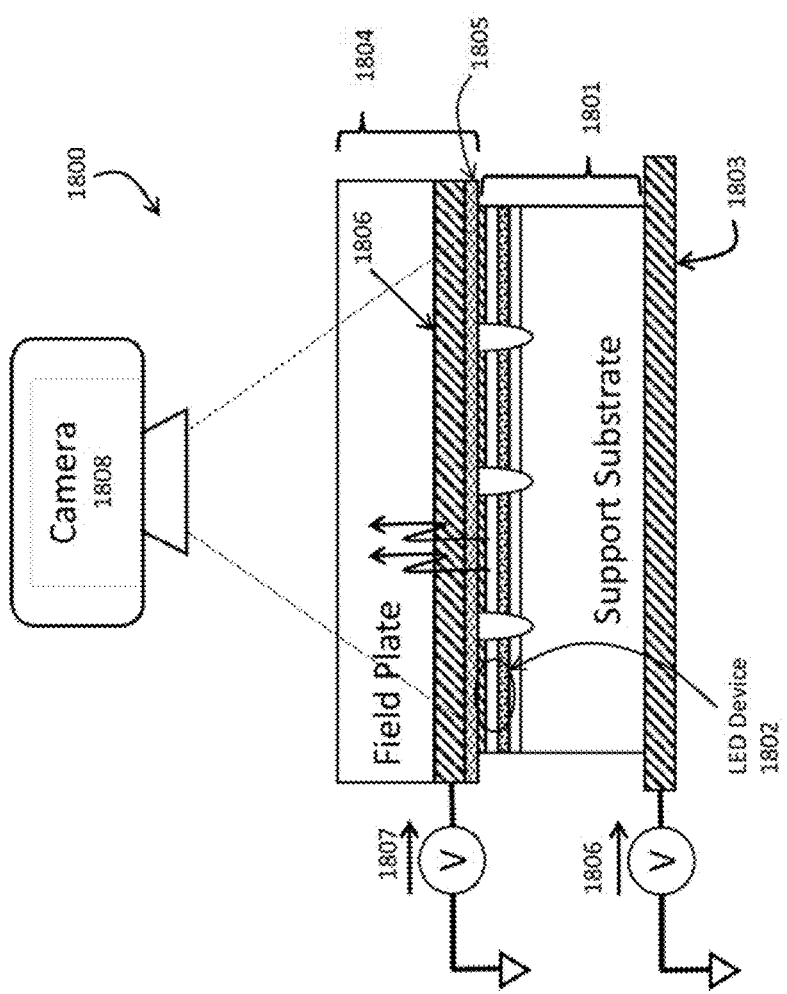
FIG. 18 shows an embodiment of a field plate in close proximity to a portion of a LED device layer containing 4 LED devices on a support substrate that is used as a dielectric layer for capacitively coupling the second electrode.

In yet another embodiment, C²I functional testing could also be applied to a modification of the test configuration of FIG. 17A that eliminates the need for a buried electrode within the support substrate. In this embodiment, the dielectric property of the support substrate itself is used to inject current through the LED devices. For example, a quartz, sapphire, glass or plastic support substrate could serve as dielectric 1704 in FIG. 17A. FIG. 18 shows a specific embodiment 1800 of this configuration. A support substrate 1801 having adequate dielectric properties and thickness containing a plurality of LED devices on its surface such as LED device 1802 is placed on top of an electrode 1803 connected to a voltage source 1806. Although not shown specifically, a gap can exist between electrode 1803 and support substrate 1801, allowing non-contact operation of the back side of the support substrate if desired. Although not shown specifically, an additional dielectric can also be interposed between electrode 1803 and support substrate 1801. The gap (and optional dielectric covering electrode 1803) will modify $C_{EFF2}$ in a similar manner as the top field plate to device gap 509 modified $C_{EFF}$ & $C_{EFF}'$ using equations 2-4. Field plate 1804 having a dielectric layer 1805 and electrode 1806 connected to a second voltage source 1807 completes the $C^2I$ functional test circuit. A camera 1808 placed above field plate 1804 is shown in this embodiment. The equivalent electrical circuit would be similar to FIG. 17B except that the value $C_{EFF2}$ is likely substantially smaller due to the thickness of the support substrate. For example, a support substrate made of sapphire ($\varepsilon_r \sim 10$) of 500 μm in thickness, $C'_{EFF2}$ will be approximately 18 pF/cm$^2$, about 65 times smaller than $C_{EFF1}$. A faster voltage ramp and/or a larger voltage value for $V_1$ could compensate for this loss of coupling efficiency. For example, field plate voltage source 1807 could be driven from 0 to +500V while the support substrate voltage source 1804 could be driven at 0 to −32.5 kV (−500V×65=−32.5 kV). The electric field strength within the sapphire support substrate would be 0.65 MV/cm, well below its breakdown strength of approximately 1 MV/cm. Driven in this fashion, the LED devices would be driven substantially equivalently and allow $C^2I$ functional test without a buried contact within the LED device support substrate. High-voltage waveform generators to drive electrode 1803 can be realized using IGBT, MOSFET, or thyristor devices. High-voltage switches capable of switching up to 36 kV are model number HTS-361-01-C (36 kV, 12 A max current) and model number HTS-361-200-FI (36 kV, 2000 A max current) from Belke Electronic GMBH (Kronberg, Germany). Programmable waveform shaping circuits could slow the fast voltage change to a voltage ramp meeting the desired $C^2I$ functional test properties. For a 6" substrate, the total capacitance would be about 3.2 nF and at 16 measurements per seconds, the ½ CV$^2$f power would be about 27 Watts and the average current would be 830 μA, safely within normal operating specifications for commercially available high-voltage switches. For the HTS-361-200-FI 2000 A capable switch, current density $C^2I$ measurements as high as 11 A/cm$^2$ could be performed. Of course, there can be other variations, modifications, and alternatives.

FIG. 19 show capacitive current injection variants A, B and C which may include up to 3 voltage sources to energize LED structure 1900. Variant A is a vertical LED structure where the top LED structure area corresponds to the top electrode (anode) and the bottom LED structure area corresponds to the bottom electrode (cathode). $C_{top-a}$ is therefore equal to $C_{EFF1}$ and $C_{bot}$ is equal to $C_{EFF2}$ of FIG. 15B. Lateral LED structures such as the LED device 1901 with a small top area etched to expose the n-layer 1902 (cathode) while the balance of the area contains the active layer, top p-layer and p-layer contact 1903 (anode). In variant B, the top anode contact is accessible by an effective capacitance $C_{top-b}$ while cathode contact area 1902 is accessible by an effective capacitance $C_{bot-b}$. The cathode area is also accessible through the support substrate 1904 via capacitance $C_{bot}$ and bottom electrode 1905. If the LED device has a total top surface area equivalent to variant A, $C_{top-b}+C_{bot-b}$ will equal $C_{top-a}$ and each capacitance value will be proportional to its surface area. For example, if the top anode area is 75% of the total area (and the top cathode area is 25% of the total area), $C_{top-b}=0.75 \times C_{top-a}$ and $C_{bot-b}=0.25 \times C_{top-a}$. There is no change in $C_{bot}$ since the total bottom area is not modified, however, the active area is smaller (75% in this example) due to the MESA etch contacting method. Effective current density injection value calculations would require active area to total area ratio correction. Variant A has a smaller top cathode contact using a via contact. Except for differing capacitances and active area to total area ratio values, this variant is similar to variant B.

Using the lateral LED MESA structure of variant B as an example LED structure, FIG. 20 shows a test assembly 2000 with three possible contacting options of three separate LED devices 2001 using a top field plate 2002 atop of the devices on the support substrate 2003 with a bottom electrode 2004. Note that electrode 2004 can be an electrode assembly including an overlying dielectric and may be placed in proximity to support substrate 2003. $C_{bot}$ would be modified to include such additional dielectric layer(s) and gap.

In option A, the top field plate electrode 2005 covers the complete LED device and is driven with a voltage ramp to voltage $V_1$. The bottom electrode 2004 is driven by a negative voltage ramp to voltage $V_2$. The top field plate electrode 2005 is assumed to be driven using a positive slope according to Phase I of FIG. 6A while the bottom electrode 2004 is assumed to be driven by a negative slope where $V_2$ is scaled appropriately by the capacitances as explained further below. Variant B is a patterned field plate electrode where only an anode electrode 2006 is present and injects current into the LED device through capacitance $C_{t-b}$. The top cathode capacitance is assumed to be negligible due to the absence of an electrode above the top cathode contact area. Variant C has a patterned field plate electrode structure where the top anode contact is capacitively coupled to field plate electrode 2007 using a positive ramp to voltage $V_1$ and the top cathode contact is capacitively coupled to field plate electrode 2008 using a negative ramp to voltage $V_3$.

Unless stated otherwise, zero net charge accumulation in the device (anode charge in=cathode charge out) and equal voltage ramp periods are assumed. Applying these bias conditions to the structures of FIG. 20 for phase I, the various relationships are as follows:

1. Variant A (lateral LED device, continuous field plate)

$$\text{Injected current}=C_{t-a} \times dV_1/dt$$

$$V_2=-V_1 \times (C_{t-a}+C_{b-a})/C_{bot}$$

2. Variant B (lateral LED device, field plate electrode on anode only)

$$\text{Injected current}=C_{t-b} \times dV_1/dt$$

$$V_2=-V_1 \times C_{t-b}/C_{bot}$$

3. Variant C (lateral LED device, separate field plate electrode on anode and cathode)

$$\text{Injected current}=C_{t-c} \times dV_1/dt$$

$$V_1 \times C_{t-c} = -V_2 \times C_{bot} - V_3 \times C_{b-c}$$

For all three structures, $J_{LED}$=Injected current/active area, where the active area is the area of the MQW structure contacted by the device.

As merely examples to demonstrate the use of C²I measurement on lateral device structures, the LED structures of FIG. 20 are assumed with the following common parameters and photo-collection configuration:
  a. 25 μm×50 μm device size
  b. 75% (anode & active area) and 25% (cathode) area split for the lateral LED Device
  c. Target $J_{LED}$=0.01 A/cm²
  d. Sapphire support substrate thickness of 1 mm ($\varepsilon_r$=10)
  e. Phase I voltage ramp time of 25 μsec
  f. Field plate dielectric: 2 μm silicon nitride ($\varepsilon_r$=7.5)
  g. $C_{t-a}=C_{t-b}=C_{t-c}$=31 fF
  h. $C_{b-a}=C_{b-c}$=10.3 fF
  i. $C_{bot}$=0.11 fF
  j. Injected current=93.7 nA
  k. $E_{opt}$=75 nJ/cm²
  l. Photons/LED device emitted ~1.5×10⁶ photons
  m. Photo-electrons detected per LED device (65% quantum efficiency, 90 mm lens aperture, 175 mm working distance) ~16,000 photo-electrons per C²I measurement cycle

VARIANT A EXAMPLE 1 a. $V_1$=+75V
  b. $V_2$=−28.2 kV

VARIANT A EXAMPLE 2 (TOP FIELD PLATE GROUNDED CONDITION)

a. $V_1$=0V
  b. $V_2$=−28.275 kV

VARIANT B EXAMPLE 1 a. $V_1$=+75V
  b. $V_2$=−21.3 kV

VARIANT B EXAMPLE 2 (TOP FIELD PLATE GROUNDED CONDITION)

a. $V_1$=0V
  b. $V_2$=−21.375 kV

VARIANT C EXAMPLE 1 a. $V_1$=+75V
  b. $V_3$=−75V, $V_2$=−14.1 kV

VARIANT C EXAMPLE 2 a. $V_1$=+75V
  b. $V_3$=−226V, $V_2$=0V

Although some common-mode charging will occur and higher bottom electrode voltage $V_2$ may be required when example 2 of variant A is used, this embodiment can be particularly useful by only requiring a grounded, nonpatterned field plate for most lateral LED structures.

In yet another embodiment, the top field plate can have a thicker dielectric and require a higher voltage $V_1$. This may have advantages in lessening top device structure topology effects, facilitate non-contact testing and improve the robustness of the top field plate from slight dielectric imperfections such as scratches and the like. For example, a 200 μm quartz field plate dielectric (element (f) in the previous example) and a 10 um air gap would require for the variant A configuration of FIG. 20 the following voltages:
  a. $V_1$=+17.4 kV
  b. $V_2$=−28.5 kV These voltages were chosen to avoid net charge transfer to the devices, essentially keeping the LED device structure close to ground potential. It is important to recognize that an air gap will breakdown and become ionized if the electric field strength is high enough. According to Paschen's Law for air at standard pressure and temperature, a 10 μm air gap will breakdown at about 350V while the above example assumed over 2.8 kV could be maintained across the air gap. Instead, for $V_1$ voltages exceeding about +2.2 kV in this example, the air gap will become ionized and lower the voltage drop across the air gap. The required $V_1$ will therefore be closer to +14.5 kV assuming no voltage drop across the ionized air gap. Of course, other voltage waveforms and values are possible to achieve the desired current injection conditions. Of course, there can be other variations, modifications, and alternatives.

When using a patterned field plate electrode pattern such as variants B and C of FIG. 20, a specific electrode pattern would be required for every lateral device structure and the top field plate dielectric thickness must be less than or of the same order as the device pitch to avoid excessive electric field cross-coupling. Moreover, accurate positional registration of a patterned top field plate between the field plate 2002 and the support substrate is important to maximize coupling efficiency and minimize parasitic capacitances (for example between electrode 2007 and the n-layer cathode contact area). Positional registration between the electrode and the LED structure within +/−5% of the device size is believed to be adequate to allow efficient coupling and reproducible C²I measurement. For multiple electrode structures, such as variant C of FIG. 20, registration is also important to avoid damaging the devices under test. For example, mis-registering the field plate to the device structures could negate current injection or even damage the LED devices by injecting substantial reverse bias voltages.

Certain image processing methods can be utilized to improve the accuracy of the measured data corresponding to each LED device under test. Each imaged LED device onto the sensor would be imaged onto a specific area within the camera sensor array. One image processing method uses spatial information from the target image to generate a physical centroid (x,y) location for each LED device within the measured camera output data image. This correspondence of LED device centroid location on the support substrate to its corresponding centroid location on the camera sensor can be developed and possibly corrected using camera magnification, optical distortion correction, image capture to sense and locate the LED device matrix and the like. The resulting centroid matrix would therefore be the set of (x,y) location within the sensor image for each LED device. For example, referring to the previous example, a 960×600 LED device set imaged onto a 1920×1200 digital sensor matrix would have a centroid matrix as follows:

Centroid for LED (i,j)=Camera data location (x,y)

Where i, j are integers (i=1 to 960, j=1 to 600) for each measured LED while the camera location (x,y) is a floating point number within the sensor pixel area (0<x<1920, 0<y<1200). Once this centroid matrix is developed, image processing methods using weighted functions can take the digitized image and develop a set of data values that are extracted using a weighing function where more weight is given to sensor data imaged closest to the physical LED centroid location. Image processing systems can accomplish this convolution function in parallel and usually at frame rate speeds. The LED data values thus comprises of an output LED device (i,j) matrix of data values calculated using centroid weighted functions applied to the digitized camera data in a preferred embodiment.

While the above describes the key steps to $C^2I$ data image capture to yield an output LED device (i,j) data point, offset and scaling/normalization operations can also be applied. For example, a "dark" image captured without the voltage waveforms would measure the dark signal for each camera pixel at the current image acquisition parameters. These dark images can be acquired along with each $C^2I$ data capture as a form of offset and drift cancellation. The reference can be subtracted from the image data or after both data and reference have been processed using centroid weighted functions described above to yield an offset-corrected LED device (i,j) data matrix. Scaling and normalization operations are also possible.

Additional image processing methods applied to the digitized camera output (proportional to the total integrated light emitted by the LED devices imaged onto the camera sensor (s) during phase I) can be utilized to develop a result indicative of LED device functionality. This functional data will be in the form of a matrix that contains one or more values derived from the measurement. For each LED at location (i,j), there will be a set of n data points $Data_n(i,j)$ =$Value_n$ (where n is an integer greater or equal to 1). Multiple independent $Data_n(i,j)$ values for each LED under test for example, could be values of light output at differing current density values measured using n measurement sequences taken with different phase I voltage ramp values. Each $Data_n(i,j)$ measurement data value can in turn be the average of multiple measurements to improve signal-to-noise ratio. Signal averaging is a well-known method where the standard deviation of a signal exhibiting stochastic noise would be reduced by sqrt(m) where m is the number of measurements points that are averaged. For example, if a data point exhibiting a stochastic noise standard deviation of z, averaged data points using the average of 100 data points would have a standard deviation of z/sqrt(100) or 10 times lower.

Figure 21:
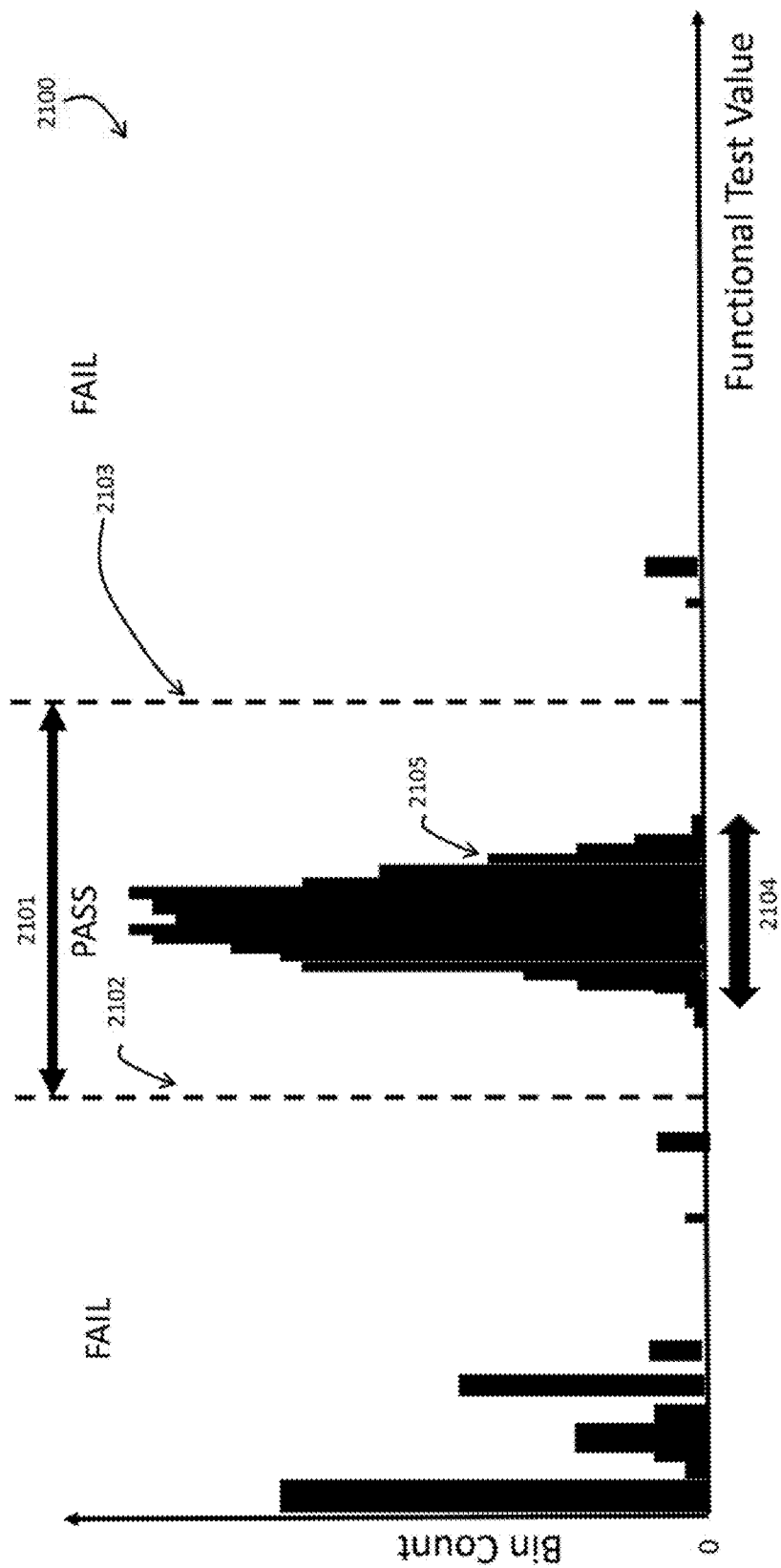
FIG. 21 shows a histogram plot of several LED devices falling within small ranges of $Data_n$ values (called channels or bins) on the vertical scale as a function of $Data_n$ in the horizontal scale.

Once the LED device (i,j) data values are collected, a threshold or set of test criteria can be applied to develop a determination of functionality, perhaps adding a $Data_n(i,j)$ value of 0 or 1 (0=bad device, 1=good device) for each LED being measured. For example, non-emitting or weakly emitting devices could be labeled as bad devices if a desired minimum threshold is applied to the data. Of course, multiple thresholds and other criteria applied to the set of data values or the pass/fail criteria could also be useful in functional test, repair strategies and process yield analysis (cause and correction). As merely an example, multiple thresholds could be applied to the LED device $Data_n(i,j)$ data to generate a bin number label for each LED device to match LEDs in functionality and drive a strategy of releasing devices with similar characteristics according to a criteria or set of criteria. Random-access laser lift-off or other individual LED device release methods could aggregate LED devices having similar bin numbers based on the bin label matrix value for each (i,j) LED device. This could be useful to limit display non-uniformity caused by using LED devices having excessively different functional characteristics. Multiple thresholds could also be utilized to develop statistics useful for yield and process control. For example, the standard deviation and other statistical analyses applied to bin data can be an indicator of yield and process stability. Sudden changes in these derived quantities can signal a process excursion. FIG. 21 shows a histogram plot 2100 of several LED devices falling within small ranges of $Data_n$ values (called channels or bins) on the vertical scale as a function of $Data_n$ in the horizontal scale. Most of the LED devices fall within a functionally acceptable range 2101 while LED devices below threshold 2102 or above threshold 2103 are considered rejects. The width 2104 of the LED device binning function can be useful for yield and process control. LED devices falling within similar bins 2105 could be later aggregated and used for their similar functional test results to improve display uniformity.

If the functional test apparatus according to this invention images less than the desired area and requires a step and repeat function, the centroid matrix may need to be recalculated for each new LED device area to be measured. If the step system is sufficiently accurate to align the next set of LED devices to be measured however, the centroid matrix may be reused. Of course, there can be other variations, modifications, and alternatives.

Generally, a field plate allows functional testing of a substrate containing LED devices to occur either by one or more cameras fixed or moved relative to the field plate. Test equipment cost, complexity, target LED device size and test throughput capability are some of the criteria that must be evaluated before a specific configuration is selected. Other design limitations and criteria must also be addressed to assure measurement functionality to desired specifications. One such design criteria is assuring the phase I voltage waveform across each LED device being tested is not significantly distorted due to contact resistance and parasitic capacitance. For example, a fast voltage ramp for Phase I desired to measure higher current density operation could cause a significant waveform distortion and voltage drop caused by RC low-pass filtering for LED devices situated in the middle of the field plate. This could occur if the field plate electrode or common contact resistance is too high. Mitigation of these effects could happen by lowering the effective contact sheet resistivity or attaching a lower resistivity layer before testing. Finally, a large field plate will require power to charge & discharge the field plate capacitance $C_{FP}$ at the measurement repetition rate and may generate resistive heating within the contact layers. For example, a 6" substrate field plate using a 3 µm silicon dioxide dielectric layer would have a total capacitance $C_{FP}$ of about 200 nF. If a 16 Hz capture rate and 500V ramp is assumed, the ½ $CV^2f$ power would be about 0.5 W. At this proposed operating point, small and manageable test power levels are generated, even with a full 6" field plate configuration.

Figure 22:
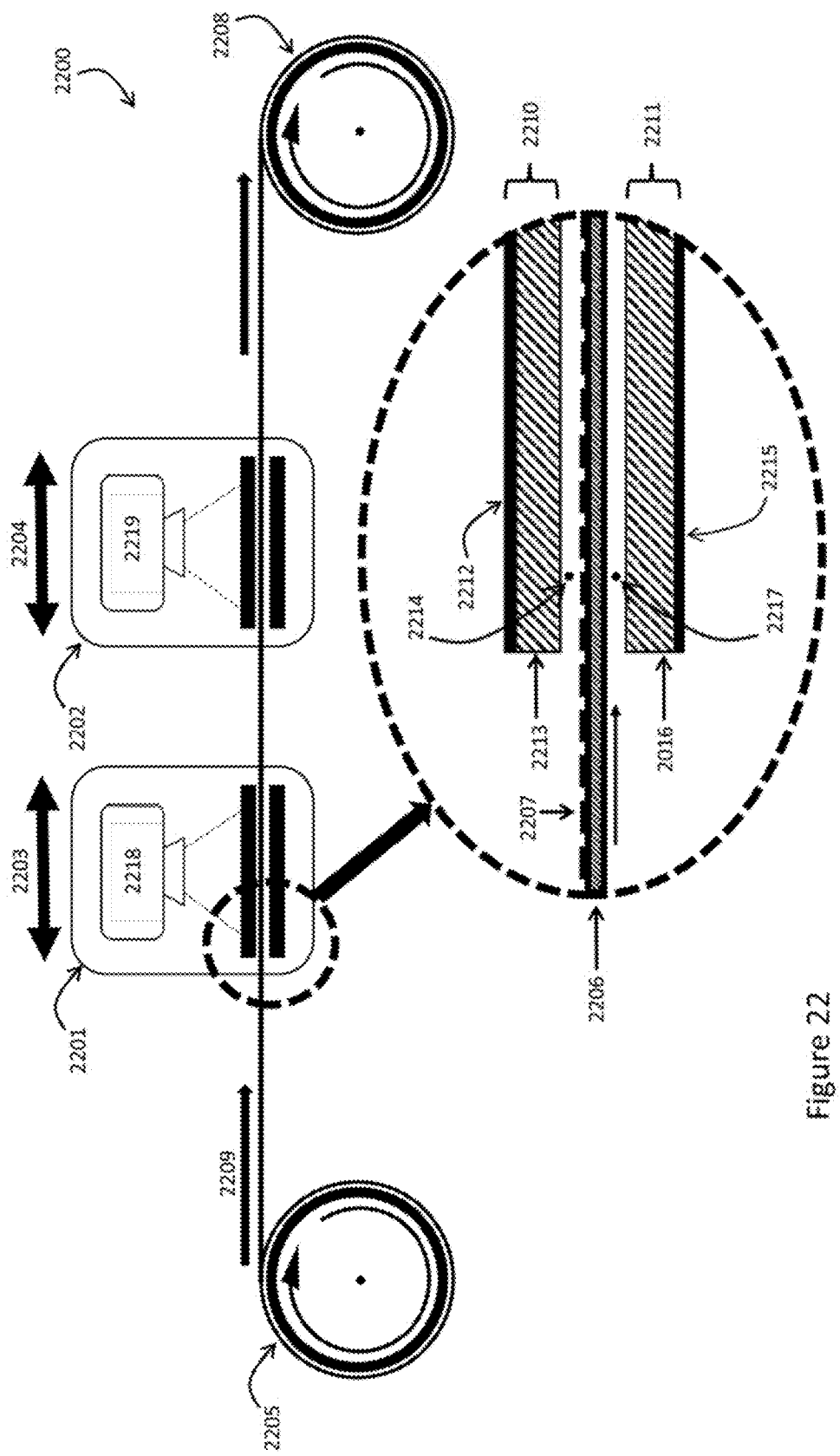
FIG. 22 shows a use of $C^2I$ functional test method within a roll-roll continuous manufacturing process where sensors are moved synchronously with the LED structure/film. Multiple sensor assemblies are used to eliminate measurement gaps.

Application of the $C^2I$ method within a roll-roll film environment such as an OLED manufacturing line may require additional elements such as mechanical stages and multiple sensor assemblies. For example, $C^2I$ testing using field plates on each side of the film within a roll-roll continuous film environment could be realized by simply moving the test assembly at the same speed as the film. FIG. 22 shows a roll-roll with $C^2I$ test 2200 where $C^2I$ measurement assemblies 2201 and 2202 are moved using motions 2203 and 2204 to follow the film towards the right to become stationary to the film in a relative sense during the test (measurement and discharge phases). The roll-roll manufacturing process is composed of a feed roll 2205 having a film 2206 supporting an LED structure 2207 to be tested. The film is moved to a take-up roll 2208 at a speed 2209. The figure shows a completely non-contact measurement configuration where top field plate 2210 and bottom field plate 2211 are placed in close proximity to the film 2206. The top field plate 2210 consists of an electrode 2212, dielectric 2213 and a gap 2214. The bottom field plate 2211 consists of at least an electrode 2215 and an optional dielectric 2216 and gap 2217 below the LED structure and support substrate/film. A camera or array of cameras 2218 and 2219 complete the C²I system. As merely an example, if the total test time (measurement through discharge phase) is 60 msec and the film is advancing at 1 m/s, the measurement field plate assembly would have to move with the film for a distance of 60 mm before moving back to enable another cycle. To avoid measurement gaps caused by the finite time to move the measurement system back to its start position, a second C²I system 2202 is used to overlap and cover the test areas. The width of the field plate 2210 and 2211 should also be about 60 mm to minimize gaps and maximize overlaps between the C²I measurement systems. Of course, there can be other variations, modifications, and alternatives to embodiments that move the field plates within a continuous manufacturing process.

Figure 23:
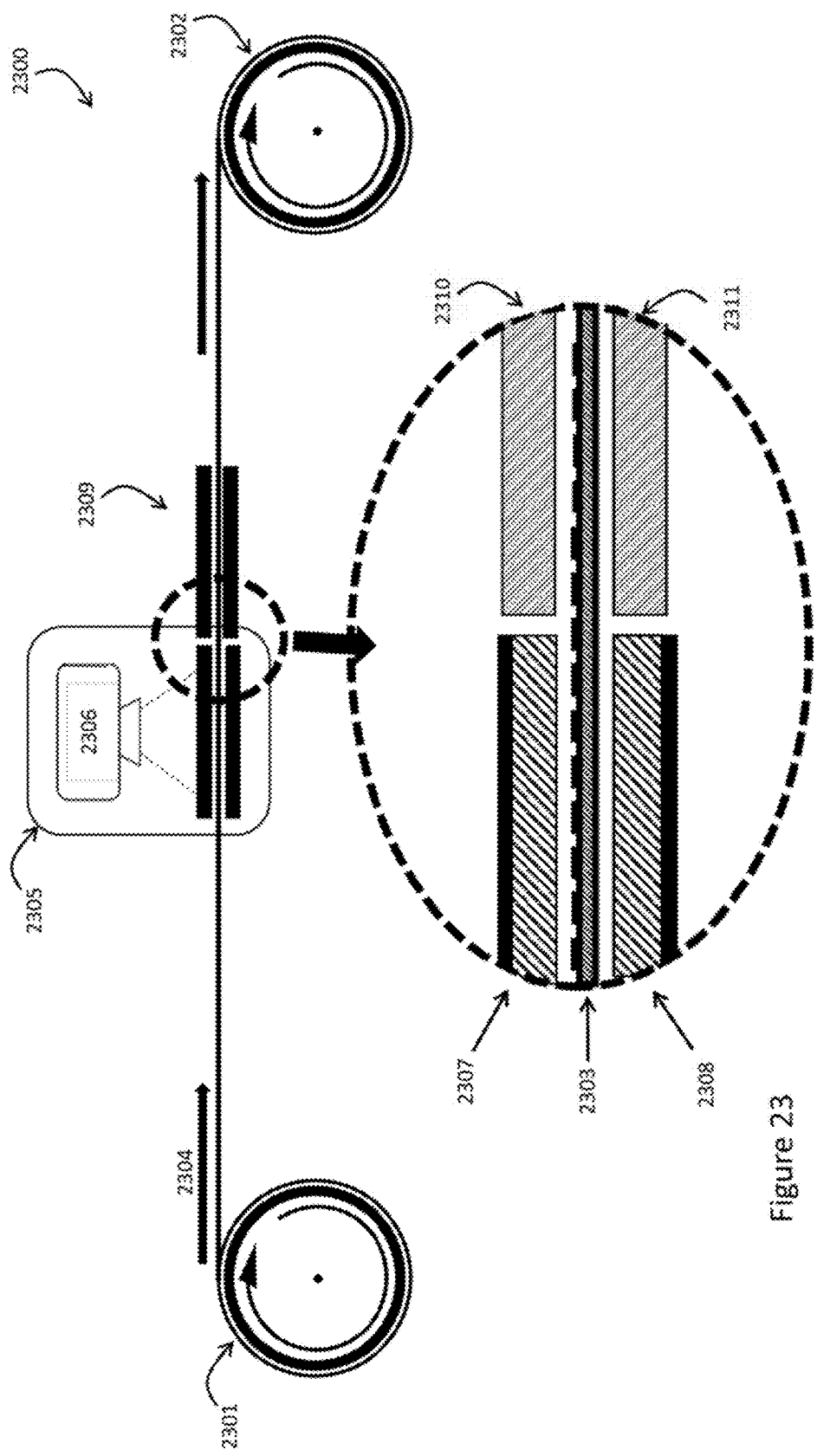
FIG. 23 shows a use of C²I functional test method within a roll-roll continuous manufacturing process where sensors are stationary and a discharge field plate assembly is used to safely discharge the LED structure.

Embodiments where a C²I system is stationary within a roll-roll manufacturing process can be desirable. FIG. 23 shows a similar roll-roll LED structure on a support film manufacturing process 2300 with rolls 2301 and 2302 rotating to move film 2303 at a velocity 2304. A stationary C²I system 2305 comprising a camera 2306 and top and bottom field plates 2307 and 2308 that are energized using measurement and discharge phase waveforms according to this invention. In this example, the measurement phase is assumed to be short compared to film velocity 2304 and thus limited blurring occurs during the measurement phase. As an example, a 25 μsec measurement phase at a film transport velocity of 500 mm/sec will only blur the image by 12.5 μm. This limited image smear will be acceptable and unlikely to adversely affect the total photo-electron count measurement. Since the C²I system is stationary (and assuming the field plate width is the test amd discharge time multiplied by the film velocity), the film just inside of the left side of the field plates will have seen the full test and discharge cycle since it will exit the right side just as the discharge cycle will have ended. For other film areas, however, the film will exit the field plate region before the discharge phase is completed. This abrupt exit from the electric field region may damage the LED devices. A secondary plate system is thus necessary to safely discharge every region tested by the stationary C²I system 2305. This additional discharge plate system 2309 consisting of special field plates 2310 and 2311 resets the electric field intensity of the LED device structure and film 2303 to a known state in order to safely discharge the film in a repeatable and uniform manner. In the following examples, the initial dielectric thickness and other plate parameters are assumed to be equal to the C²I system field plates and operating bias conditions. Other combination of parameters such as voltage bias, plate dielectric thickness and interaction width are possible to perform the discharge phase.

During the discharge state, a charge density Q' (coulomb s/cm²) stored within the field plates, gaps, LED structure and support substrate must be discharged in a manner that limits the LED reverse bias levels to safe values. A constant reverse bias leakage current density $-I_L'$ is assumed. FIG. 24A-B show two embodiments 2400 and 2401 of the discharge plate system. As the film 2402 enters the right discharge plate assemblies at location 2403, the charge state is raised by voltage potentials $V_1$ and $V_2$ applied to at least the leftmost region of the discharge plate assembly. These voltages are selected to be the full voltages used during the measurement phase to the top and bottom plates respectively. At that state, the charge density is related to voltage $V_1$ & $V_2$ as follows:

$$Q' = C'_{EFF} \times V \qquad (17)$$

Q'=Total initial charge density in the discharge plate assembly (coul/cm²)
$C'_{EFF}$=Effective capacitance per unit area of the measurement system (F/cm²)
$V=V_1+V_2$, the maximum test voltages ($V_1$ is assumed to be opposite polarity from $V_2$)
At a constant discharge rate (dQ'/dt=$-I_L'$):

$$-I_L' = C'_{EFF} \times dV/dt + V \times dC'_{EFF}/dt \qquad (18)$$

If the time derivatives of equation 18 above are in turn related to the film velocity, a spatial change of dV/dt or $dC'_{EFF}/dt$ over the width of the discharge plate assembly satisfying equation 18 would safely discharge the LED structure. FIG. 24A shows a safe discharge using linearly decreasing voltages from $V_1$ to 0 on the top field plate and $V_2$ to 0 on the bottom field plate in the discharge plate assembly 2400. The width of the discharge plate would be selected to satisfy equation 18 at the film velocity.

If the dielectric thickness of the top and bottom discharge field plates are instead increased over the width of the discharge plate in a spatial manner so as to satisfy the second term of equation 18, safe discharge of the LED structure will also occur. FIG. 24B shows this second embodiment using constant $V_1$ and $V_2$ over the width of the discharge plate assembly 2401. Alternatively, a combination of embodiments described in FIGS. 24A and 24B could also be used to generate the desired discharge phase. Of course, there can be other variations, modifications, and alternatives to embodiments that have stationary field plates within a continuous manufacturing process.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, although the description and examples has been directed towards GaN LED devices on a planar surface, any planar or curved surface containing photon emitting devices could be functionally tested using the C²I method. For example, Vertical-Cavity Surface-Emitting Lasers (VCSELs), Organic LEDs (OLEDs), silicon photonics devices and other surface emitting devices could be tested using this invention. Additionally, in another example, II-VI semiconductor materials and associated devices can also be used. In an example, the LED or other device can have a variety of applications such as general or specialized lighting, a display, whether a large panel, mobile device, or projection, chemical treatment, vehicle lighting, medical, and others. In an example, the method can also include selecting one of the good devices, releasing said LED device onto a member substrate and packaging the device. A member substrate can include the final product substrate or a temporary substrate to receive the released LED device. The package can be a standard can, chip on board, or submount, or module device. After the device is packaged, it can be configured in one of a variety of applications. Of course, there can be other variations, modifications, and alternatives. Therefore, the above description and illustrations should not be taken as limiting the scope of the present invention which is defined by the appended claims.

What is claimed is:

1. An apparatus for observing light emission from a light-emitting device structure disposed on a support substrate having a first contact layer accessible from a surface and a second contact layer included on the light-emitting device structure, the light-emitting device structure being selected from either a vertical light-emitting device structure or a lateral light-emitting device structure, the apparatus comprising:
   a field plate device, the field plate device having a first face and a second face opposing the first face, the second face comprising a conductive layer, and an overlying dielectric layer, the dielectric layer being positioned in close proximity to at least a portion of the first contact layer of the light-emitting device structure;
   a voltage source for producing a voltage, the voltage source being capable of generating a time-varying voltage waveform, the voltage source having a first terminal and a second terminal, the first terminal having a first potential coupled to the conductive layer of the field plate device, the second terminal at a second potential, the voltage source being capable of injecting a capacitively coupled current to the light-emitting device structure to cause at least a portion of the light-emitting device structure to emit electromagnetic radiation in a pattern; and
   a detector device coupled to the light-emitting device structure to form an image of the electromagnetic radiation in the pattern derived from the light-emitting device structure; and
   wherein the time-varying voltage waveform is a voltage ramp from a first voltage potential to a second voltage potential to forward bias the light-emitting device structure at a selected current density during a measurement phase, and the time-varying voltage waveform after the measurement phase is returned from the second voltage potential to the first voltage potential over a reset phase time period during a reset phase selected to use a reverse bias leakage current density of the light-emitting device structure and avoid exceeding potentially damaging reverse bias voltage.

2. The apparatus of claim 1 wherein the second terminal is electrically coupled to a backside of the support substrate, the second potential being at ground potential or at negative potential or positive potential in relation to the ground potential to create the time-varying voltage waveform.

3. The apparatus of claim 1 wherein the first terminal is electrically connected to the conductive layer of the field plate device and being at a ground potential or at a negative potential or a positive potential in relation to the ground potential to create the first potential.

4. The apparatus of claim 1 wherein the second face of the field plate device comprising the dielectric layer is positioned on and in contact with the portion of the first contact layer.

5. The apparatus of claim 1 wherein the second face of the field plate device comprising the dielectric layer is positioned in close proximity to form a spatial gap between the second face and the portion of the first contact layer.

6. The apparatus according to claim 1 wherein the lateral light-emitting device structure comprises a first contact layer and a second contact layer, the first contact layer and the second contact layer being electrically accessible on at least one face of the lateral light-emitting device structure.

7. The apparatus according to claim 1 wherein the image is a derived from a light output of an emitting surface of the light emitting device structure resulting from application of a capacitively coupled time varying voltage waveform.

8. The apparatus according to claim 3 wherein the conductive layer is patterned and comprises a first portion within a vicinity of the first contact layer and a second portion within a vicinity of the second contact layer, the first portion being electrically and physically separated from the second portion the first portion being connected to the first terminal of the voltage source, and the second portion being connected to another voltage source or a ground potential.

9. The apparatus according to claim 3 wherein the conductive layer comprises a first portion within a vicinity of the first contact layer and an absence of a conductive layer within a vicinity of the second contact layer.

10. The apparatus according to claim 1 wherein the vertical light-emitting device structure comprises the first contact layer and the second contact layer underlying the light-emitting device structure.

11. The apparatus according to claim 1 further comprising a lens coupled to the detector device for focusing the electromagnetic radiation provided on the detector device.

12. The apparatus according to claim 1 wherein the detector device comprises imaging the electromagnetic radiation to produce an observable map of the pattern of electromagnetic radiation as a function of position over the light-emitting device structure of the support substrate.

13. The apparatus according to claim 1 wherein the detector device comprises a camera; and further comprising an electrical access coupled to the second contact layer of the light-emitting device structure using an electrical contact or using capacitive coupling.

14. The apparatus according to claim 13 wherein the camera integrates the electromagnetic radiation over the time-varying voltage waveform to produce a spatial map of total electromagnetic radiation produced over the light-emitting device structure.

15. The apparatus according to claim 14 wherein the spatial map of integrated electromagnetic radiation is processed using image processing device to perform one or more functions selected from the group consisting of: signal averaging, thresholding, and binning to develop a spatially-dependent functional test result of the light-emitting device structure.

16. The apparatus according to claim 1 wherein the first contact layer of the light-emitting device structure is isolated using a material removal process to realize a plurality of individually addressable light-emitting devices.

17. The apparatus according to claim 1 wherein the first and second contact layers of the light-emitting device structure are isolated using a material removal process to realize a plurality of individually addressable light-emitting devices.

18. The apparatus according to claim 1 wherein the detector device comprises a camera; and further comprising an electrical access coupled to the second contact layer of the light-emitting device structure using an electrical contact or using capacitive coupling, and wherein the camera is one of a plurality of cameras, each positioned to image a separate area of the light-emitting device structure.

19. The apparatus according to claim 1 wherein the detector device comprises a camera; and further comprising an electrical access coupled to the second contact layer of the light-emitting device structure using an electrical contact or using capacitive coupling, and wherein the camera and a smaller field plate device is an assembly that can image a smaller test area and mechanically indexed in a step and repeat fashion for more complete test coverage.

20. The apparatus according to claim 1 wherein the field plate device is approximately a same areal dimension to the support substrate and is placed on the support substrate to allow substantially complete functional testing of the support substrate without step and repeat indexing of the field plate device.

21. The apparatus according to claim 1 wherein the field plate is placed in close proximity to the support substrate using a seal near a periphery of the field plate and air is evacuated from the gap between the second face of the field plate device comprising the dielectric layer and the portion of the first contact layer using a vacuum port.

22. The apparatus according to claim 1 wherein the close proximity between the field plate and the support substrate device is actual contact.

23. The apparatus according to claim 1 wherein the close proximity between the field plate device and the support substrate device is characterized by a small gap comprising one or more of a gas, a vacuum, a liquid or a solid, the small gap being no larger than 5 times a lateral distance of a light emitting diode tLED) device to be formed from the light emitting device structure.

24. A method of manufacturing an optical device, the method comprising:
provising a light-emitting device structure, the light-emitting device structure having a plurality of light emitting diode (LED) devices to be formed, disposed on a support substrate having a first contact layer accessible from a surface and a second contact layer included on the light-emitting device structure, the light-emitting device structure being either a vertical light emitting device structure or a lateral light emitting device structure;
coupling a field plate device to the light-emitting device structure, the field plate device having a first face and a second face opposing the first face, the second face comprising a conductive layer, and an overlying dielectric layer, the dielectric layer being positioned in close proximity to at least a portion of the first contact layer of the light-emitting device structure such that a spatial gap is formed between a surface region of the dielectric layer and the first face contact layer of the light-emitting device structure;
generating a time-varying voltage waveform from a voltage source to form a voltage potential between the dielectric layer of the field plate device and the light-emitting device structure to inject a capacitively coupled current to the light-emitting device structure to cause at least a portion of the light-emitting device structure to emit electromagnetic radiation in a pattern, the voltage source having a first terminal and a second terminal, the first terminal having a first potential coupled to the conductive layer of the field plate device, the second terminal at a second potential; and
capturing, using a detector device coupled to the light-emitting device structure, an image of the electromagnetic radiation in the pattern derived from the light-emitting device structure;
wherein the time-varying voltage waveform is a voltage ramp from a first voltage potential to a second voltage potential to forward bias the light-emitting device structure at a selected current density during a measurement phase, and the time-varying voltage waveform after the measurement phase is returned from the second voltage potential to the first voltage potential over a reset phase time period during a reset phase selected to use a reverse bias leakage current density of the light-emitting device structure and avoid exceeding potentially damaging reverse bias voltage.

25. The method according to claim 24 wherein the detector device comprises imaging the electromagnetic radiation to produce an observable map of the pattern of electromagnetic radiation as a function of position over the light-emitting device structure of the support substrate.

26. The method according to claim 25 wherein the detector device comprises a camera.

27. The method according to claim 26 wherein the field plate device is transmissive and the camera is mounted to image the light-emitting device structure to collect the electromagnetic radiation through the field plate device.

28. The method according to claim 26 wherein the support substrate is transmissive and the camera is mounted to image the light-emitting device structure to collect the electromagnetic radiation through the support substrate.

29. The apparatus according to claim 26 wherein the camera integrates the electromagnetic radiation over the time-varying voltage waveform to produce a spatial map of total electromagnetic radiation produced over the light-emitting device structure.

30. The apparatus according to claim 29 wherein the spatial map of integrated electromagnetic radiation is processed using image processing device to perform one or more functions selected from the group consisting of: signal averaging, thresholding and binning to develop a spatially-dependent functional test result of the light-emitting device structure.

31. The method according to claim 24 wherein the first contact layer of the light-emitting device structure is isolated using a material removal process to realize a plurality of individually addressable light-emitting devices.

32. The method of claim 24 wherein the first and second contact layers of the light-emitting device structure are isolated using a material removal process to realize a plurality of individually addressable light-emitting devices.

* * * * *